US012495668B2

(12) United States Patent
Ito et al.

(10) Patent No.: US 12,495,668 B2
(45) Date of Patent: Dec. 9, 2025

(54) ORGANIC LIGHT-EMITTING ELEMENT, LIGHT-EMITTING DEVICE, DISPLAY APPARATUS, IMAGE PICKUP APPARATUS, ELECTRONIC APPARATUS, ILLUMINATION APPARATUS, MOVING OBJECT, AND IMAGE-FORMING APPARATUS

(71) Applicant: CANON KABUSHIKI KAISHA, Tokyo (JP)

(72) Inventors: Takayuki Ito, Kanagawa (JP); Kentaro Ito, Tokyo (JP); Norifumi Kajimoto, Kanagawa (JP); Yojiro Matsuda, Kanagawa (JP); Hiroaki Sano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 448 days.

(21) Appl. No.: 18/190,780

(22) Filed: Mar. 27, 2023

(65) Prior Publication Data
US 2023/0320122 A1    Oct. 5, 2023

(30) Foreign Application Priority Data
Mar. 31, 2022    (JP) .................................. 2022-059449

(51) Int. Cl.
*H10K 50/16*    (2023.01)
*H10K 50/15*    (2023.01)
(Continued)

(52) U.S. Cl.
CPC ......... *H10K 50/166* (2023.02); *H10K 50/156* (2023.02); *H10K 59/12* (2023.02); *H10K 2102/351* (2023.02)

(58) Field of Classification Search
CPC .... H10K 50/166; H10K 50/156; H10K 59/12; H10K 2102/351; H10K 50/854;
(Continued)

(56) References Cited

U.S. PATENT DOCUMENTS 9,472,767 B2    10/2016   Im
2012/0018707 A1   1/2012   Lee
(Continued)

FOREIGN PATENT DOCUMENTS

JP    2006005328 A    1/2006
JP    2006302748 A    11/2006
(Continued)

OTHER PUBLICATIONS

Lee Jiun-Haw et al.; Mixed Host Organic Ligh-Emitting Devices with Low Driving Voltage and Long Lifetime; American Institute of Physics; Mar. 3, 2005; pp. 1-3.

*Primary Examiner* — Mohammad A Rahman
(74) *Attorney, Agent, or Firm* — Canon U.S.A., Inc. IP Division

(57) ABSTRACT

The present disclosure provides an organic light-emitting element including a first electrode, an organic compound layer, and a second electrode, wherein the organic compound layer includes a charge transport layer, and the charge transport layer includes a first charge transport layer, a second charge transport layer, and a third charge transport layer in this order, and the first charge transport layer, the second charge transport layer, and the third charge transport layer satisfy Formulas (1) and (2) below:

$$\mu_1 > \mu_2 > \mu_3 \quad (1)$$

$$d_1 + d_2 < d_3 \quad (2)$$

in Formula (1), $\mu_1$, $\mu_2$, and $\mu_3$ are charge mobilities of the first to third charge transport layers, and
in Formula (2), $d_1$, $d_2$, and $d_3$ are layer thicknesses of the first to third charge transport layers.

22 Claims, 10 Drawing Sheets

(51) Int. Cl.
*H10K 59/12* (2023.01)
*H10K 102/00* (2023.01)

(58) Field of Classification Search
CPC .. H10K 59/65; H10K 2101/40; H10K 50/856; H10K 50/14; H10K 50/11; H10K 59/10; F21S 43/145; G03G 15/04063; H04N 23/50; H05B 33/12
See application file for complete search history.

(56) References Cited

U.S. PATENT DOCUMENTS

| | | | |
|---|---|---|---|
| 2014/0001444 A1* | 1/2014 | Kim | H10K 50/156 257/40 |
| 2016/0104854 A1 | 4/2016 | Jeon | |
| 2019/0207122 A1 | 7/2019 | Lim | |

FOREIGN PATENT DOCUMENTS

| | | |
|---|---|---|
| JP | 2010199504 A | 9/2010 |
| JP | 2015122459 A | 7/2015 |
| JP | 2018200939 A | 12/2018 |
| JP | 2020024980 A | 2/2020 |
| JP | 2021118358 A | 8/2021 |
| KR | 20110101418 A | 9/2011 |
| KR | 20120010438 A | 2/2012 |
| KR | 20170040851 A | 4/2017 |
| KR | 20190081155 A | 7/2019 |
| KR | 20210106037 A | 8/2021 |
| KR | 20220024355 A | 3/2022 |

\* cited by examiner

ORGANIC LIGHT-EMITTING ELEMENT, LIGHT-EMITTING DEVICE, DISPLAY APPARATUS, IMAGE PICKUP APPARATUS, ELECTRONIC APPARATUS, ILLUMINATION APPARATUS, MOVING OBJECT, AND IMAGE-FORMING APPARATUS

BACKGROUND OF THE INVENTION

Field of the Invention

The present invention relates to an organic light-emitting element, a light-emitting device, a display apparatus, an image pickup apparatus, an electronic apparatus, an illumination apparatus, a moving object, and an image-forming apparatus.

Description of the Related Art

In recent years, organic light-emitting elements (also referred to as organic EL elements or OLEDs) serving as light sources have been developed. Display apparatuses including red (R), green (G), and blue (B) organic light-emitting elements provide a full-color display. In particular, in goggle display devices used for augmented reality (AR) or virtual reality (VR), finer pixels and a larger number of pixels are used and a further reduction in the power consumption of the display apparatuses is in demand. On the other hand, it is known that one of the measures for reducing the power consumption is to reduce the driving voltage of organic light-emitting elements.

Japanese Patent Laid-Open No. 2015-122459 (hereinafter PTL) describes an organic light-emitting element including an organic compound layer, where the organic compound layer includes a plurality of hole transport layers in which a hole transport layer having the greatest thickness has a higher hole mobility than the other hole transport layers, to thereby achieve a reduction in the driving voltage of the organic light-emitting element.

However, to achieve a reduction in the driving voltage as described in PTL, increase in the hole mobility of the hole transport layer having the greatest thickness also causes a current to be supplied to adjacent organic light-emitting elements, which in turn causes unintended light emission. Such unintended light emission causes a reduction in the display color gamut of display apparatuses, which has been problematic.

SUMMARY OF THE INVENTION

The present invention provides an organic light-emitting element in which the driving voltage of the organic light-emitting element is reduced and unintended light emission in adjacent organic light-emitting elements can be reduced.

An organic light-emitting element according to an embodiment of the present disclosure provides an organic light-emitting element including a first electrode on an insulating layer, a first light-emitting layer on the first electrode, a second electrode on the first light-emitting layer, and a charge transport layer between the first electrode and the first light-emitting layer, wherein the charge transport layer includes a first charge transport layer, a second charge transport layer, and a third charge transport layer in this order from the first electrode, and the first charge transport layer, the second charge transport layer, and the third charge transport layer satisfy Formulas (1) and (2) below:

$$\mu 1 > \mu 2 > \mu 3 \tag{1}$$

$$d1 + d2 < d3 \tag{2}$$

In Formula (1), $\mu 1$ is a charge mobility of the first charge transport layer, $\mu 2$ is a charge mobility of the second charge transport layer, and $\mu 3$ is a charge mobility of the third charge transport layer.

In Formula (2), d1 is a layer thickness of the first charge transport layer, d2 is a layer thickness of the second charge transport layer, and d3 is a layer thickness of the third charge transport layer.

Further features of the present invention will become apparent from the following description of exemplary embodiments with reference to the attached drawings.

DESCRIPTION OF THE EMBODIMENTS

Figure 1A:
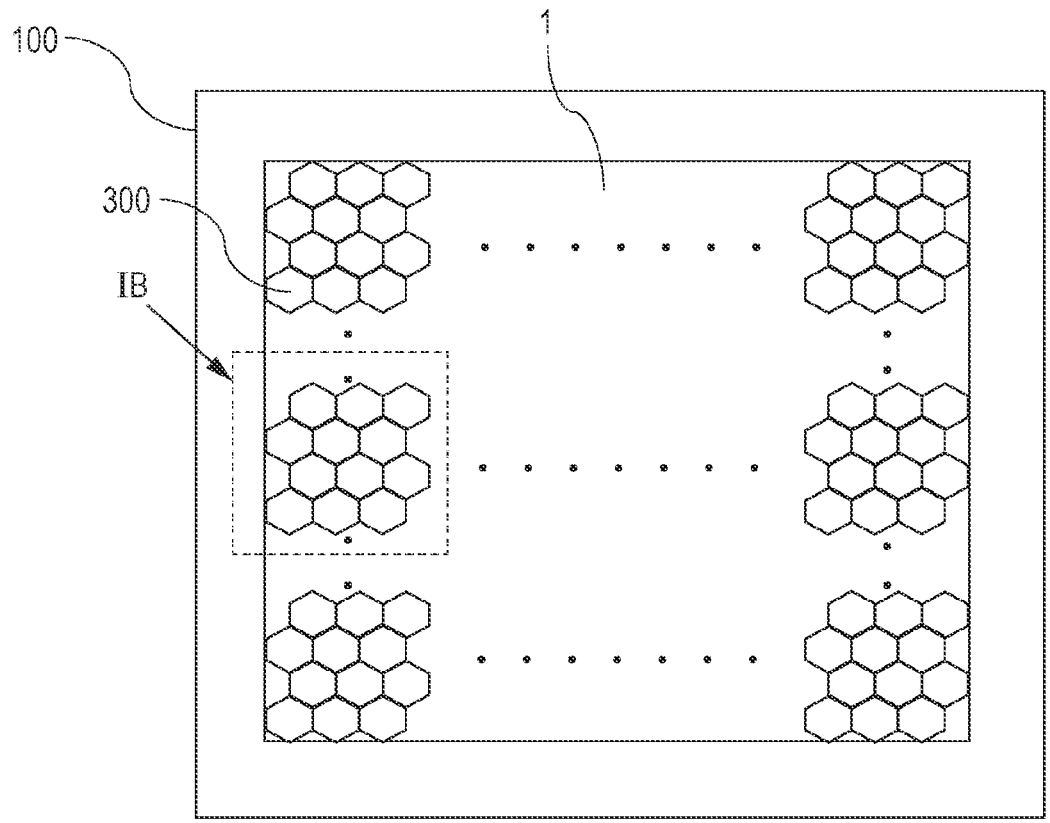
FIG. 1A is a plan view of a light-emitting device according to an embodiment of the present invention.

An organic light-emitting element according to an embodiment of the present invention is an organic light-emitting element including a first electrode on an insulating layer, a first light-emitting layer on the first electrode, a second electrode on the first light-emitting layer, and a charge transport layer between the first electrode and the first light-emitting layer, wherein the charge transport layer includes a first charge transport layer, a second charge transport layer, and a third charge transport layer in this order from the first electrode, the first charge transport layer, the second charge transport layer, and the third charge transport layer satisfy Formulas (1) and (2) below:

$$\mu1 > \mu2 > \mu3 \quad (1)$$

$$d1 + d2 < d3 \quad (2)$$

In Formula (1), μ1 is a charge mobility of the first charge transport layer, μ2 is a charge mobility of the second charge transport layer, and μ3 is a charge mobility of the third charge transport layer.

In Formula (2), d1 is a layer thickness of the first charge transport layer, d2 is a layer thickness of the second charge transport layer, and d3 is a layer thickness of the third charge transport layer.

An organic light-emitting element according to another embodiment of the present invention is an organic light-emitting element including a first electrode, a second electrode, a first light-emitting layer disposed between the first electrode and the second electrode, and a charge transport layer between the first electrode and the first light-emitting layer, wherein the charge transport layer includes a first charge transport layer, a second charge transport layer having a lower charge mobility than the first charge transport layer, and a third hole transport layer having a lower charge mobility than the first charge transport layer, and the first charge transport layer has a layer thickness less than a layer thickness of the second charge transport layer and a layer thickness of the third hole transport layer.

The charge transport layer, the first light-emitting layer, and the organic layers between the first electrode and the second electrode may be collectively referred to as organic compound layers. The same applies to cases where other organic layers are disposed.

The charge transport layer may be a hole transport layer or an electron transport layer. When the charge transport layer is a hole transport layer, the charge mobility is a hole mobility; when the charge transport layer is an electron transport layer, the charge mobility is an electron mobility. When the relations of layer thickness and mobility are satisfied, a leakage current of the organic light-emitting element and its adjacent organic light-emitting elements can be reduced. Organic light-emitting elements may also be referred to as sub pixels of display apparatuses.

The charge transport layer can be a hole transport layer. This is because organic compounds tend to have a hole transport ability and, in such a hole transport layer, a leakage current between the organic light-emitting element and its adjacent organic light-emitting elements tends to be generated.

The charge transport layer according to an embodiment of the present invention includes a first charge transport layer, a second charge transport layer, and a third charge transport layer, and the first charge transport layer has a lower charge mobility than the second charge transport layer and the third charge transport layer. The second charge transport layer has a lower charge mobility than the third charge transport layer.

The first charge transport layer has a layer thickness less than the second charge transport layer and the third charge transport layer. The second charge transport layer can have a layer thickness less than the third charge transport layer.

The first charge transport layer according to an embodiment of the present invention contains a first organic compound and the third charge transport layer contains a third organic compound. The second charge transport layer may be a mixture layer of the first organic compound and the third organic compound.

The content of the third organic compound relative to the total amount of the first organic compound and the third organic compound contained in the second charge transport layer may be 50 vol % or more. The content of the third organic compound relative to the total amount of the first organic compound and the third organic compound contained in the second charge transport layer may be 50 wt % or more. The content of the third organic compound relative to the total amount of the first organic compound and the third organic compound contained in the second charge transport layer may be 50 mol % or more.

An organic light-emitting element according to an embodiment of the present invention can be used for a display apparatus having a pixel density of 1000 ppi (pixels per inch) or more. This is because the higher the pixel density, the higher the probability of generation of a leakage current between an organic light-emitting element and its adjacent organic light-emitting elements. Thus, advantages of reducing a leakage current due to the organic light-emitting element according to this embodiment are markedly provided.

In an organic light-emitting element according to an embodiment of the present invention, the charge transport layer can have a layer thickness of 20 nm or less. This is because such a small layer thickness results in a low leakage current between such organic light-emitting elements and such a small layer thickness itself results in a decrease in the leakage current.

Hereinafter, the present invention will be described more specifically with reference to embodiments. The embodiments are non-limiting examples of the present invention. Features described for the embodiments may be combined together.

First Embodiment

Hereinafter, an embodiment according to the present invention will be described with reference to drawings.

FIG. 1A is a plan view of a light-emitting device according to an embodiment of the present invention. The light-emitting device includes a light-emitting region 1 on a substrate 100 and, in the light-emitting region 1, a plurality of organic light-emitting elements 300 are arranged.

In a region IB, a plurality of organic light-emitting elements 300 are arranged.

Figure 1B:
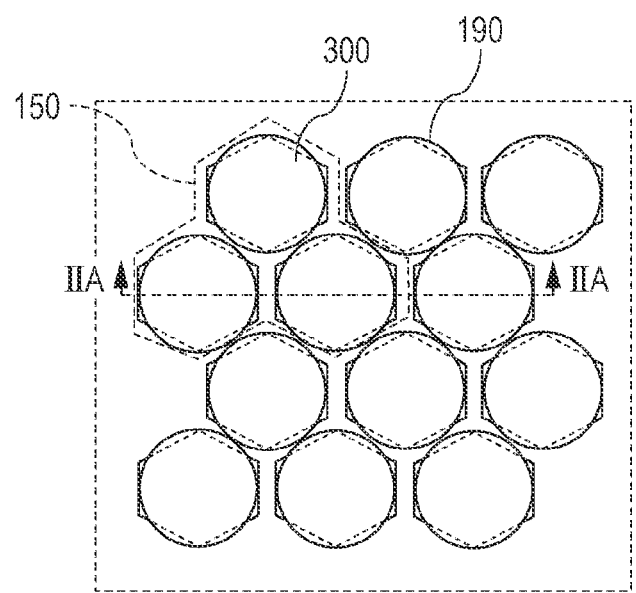
FIG. 1B is an enlarged view of a region IB in FIG. 1A.

FIG. 1B is an enlarged view of the region IB in FIG. 1A. The organic light-emitting element surrounded by a dot line 150 is a single pixel. The pixel includes a plurality of sub pixels 300 configured to emit individually light of different colors. For example, the sub pixels 300 are configured to emit individually light of red (R), green (G), and blue (B) and constitute a single pixel (W) 150. Each of the sub pixels 300 includes an optical member 190 for extracting light emitted from the light-emitting region of the sub pixel. Such sub pixels are divided by pixel division layers described later.

The pixel array of the light-emitting device according to this embodiment has, what is called, the delta pattern; however, the present invention is not limited to this. Alternatively, the pixel array may have, for example, a stripe pattern, a square pattern, a PenTile pattern, or a Bayer pattern. Similarly, the shape of the light-emitting region is not limited to the illustrated shape, and may be a circular shape, an elliptical shape, or a polygonal shape such as a hexagonal shape or a quadrangular shape.

Figure 2A:
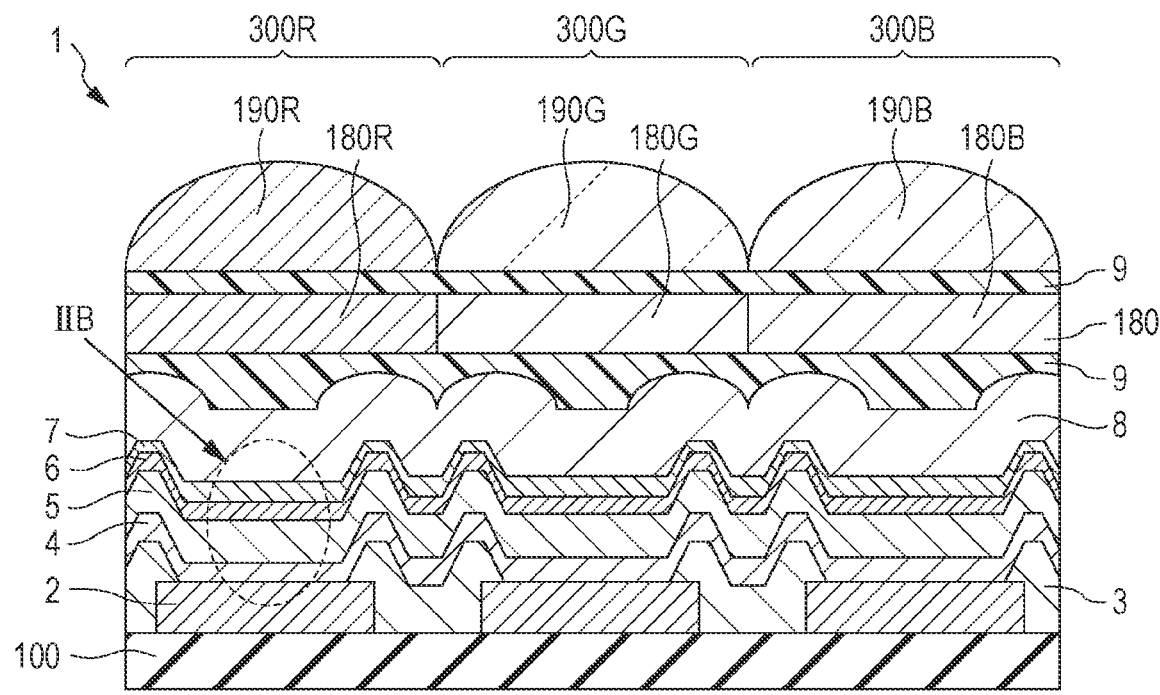
FIG. 2A is a schematic sectional view taken along line IIA-IIA in FIG. 1B.

FIG. 2A is a schematic sectional view taken along line IIA-IIA in FIG. 1B. The light-emitting region 1 includes a plurality of sub pixels 300 that are, in this case, a red sub pixel 300R, a green sub pixel 300G, and a blue sub pixel 300B. Each of the sub pixels 300 includes a first electrode 2 on an insulating layer 100. A pixel division layer 3 is disposed so as to cover the edge portions of the first electrode 2. The pixel division layer 3 is also referred to as a bank layer. On the first electrode 2 and the pixel division layer 3, an organic compound layer including a light-emitting layer is disposed. The upper surface of the first electrode 2 includes a first region in contact with the organic compound layer and a second region in contact with the pixel division layer 3.

The organic compound layer includes a charge transport layer 4 for transporting holes, a light-emitting layer 5, and an electron transport layer 6. On the organic compound layer, a second electrode 7 is disposed. The first electrode 2, the organic compound layer, and the second electrode 7 constitute an organic light-emitting element C.

The organic compound layer and the second electrode 7 are disposed so as to be shared by the sub pixels 300. On the second electrode 7, a protective layer 8 for protecting the organic light-emitting element C is disposed. The protective layer 8 is also referred to as a sealing layer. On the protective layer 8, a planarization layer 9 is disposed. The planarization layer 9 is referred to as a resin layer on the basis of the composition.

On the planarization layer 9, a color filter 180 is disposed. Color filters 180R, 180G, and 180B are disposed so as to correspond to the sub pixels 300. On the color filter 180, a planarization layer 9 is disposed. The planarization layer 9 may be separated from the planarization layer 9 in contact with the protective layer 8 or the planarization layers 9 may be in contact with each other in edge portions (not shown). The planarization layer 9 in contact with the protective layer 8 and the planarization layer 9 disposed on the color filter may have the same composition or may have different compositions. The planarization layer 9 in contact with the protective layer 8 may be referred to as a first planarization layer. The planarization layer 9 disposed on the color filter 180 may be referred to as a second planarization layer. The planarization layers 9 may also be referred to as a first resin layer and a second resin layer on the basis of the constituent substances.

On the second planarization layer 9, a lens 190 is disposed as an optical member. The lens 190 includes 190R, 190G, and 190B disposed so as to correspond to the sub pixels 300.

Figure 2B:
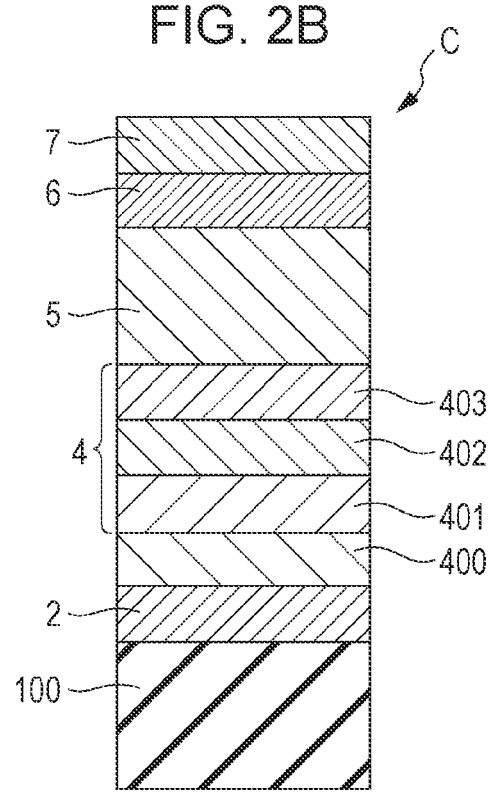
FIG. 2B is a schematic sectional view of an organic light-emitting element region in broken line IIB in FIG. 2A.

FIG. 2B is a schematic sectional view of the organic light-emitting element region surrounded by broken line IIB in FIG. 2A.

On the insulating layer 100, the first electrode 2, the second electrode 7, and an organic compound layer disposed between the first electrode 2 and the second electrode 7 and including a light-emitting layer 5 are disposed. The first electrode 2 may function as a reflective layer. In this embodiment, the first electrode 2 is an anode and the second electrode 7 is a cathode. In this case, the organic compound layer includes a charge transport layer 4 for transporting holes, the light-emitting layer 5, and an electron transport layer 6. The charge transport layer 4 includes a first charge transport layer 401, a second charge transport layer 402, and a third charge transport layer 403.

Between the first electrode 2 and the charge transport layer 4, an electron extraction layer 400 may be disposed.

The electron extraction layer 400 allows for improved adhesiveness between the first electrode 2 and the charge transport layer 4 and the hole injection ability is also improved. The electron extraction layer 400 has a function of extracting electrons from the first charge transport layer 401 in contact with the electron extraction layer 400 to thereby generate holes in the first charge transport layer 401. In this case, in the electron extraction layer 400, the electrons having been extracted from the first charge transport layer 401 are generated and the electrons flow into the first electrode 2.

A charge transport layer of an organic light-emitting element according to an embodiment of the present invention will be more specifically described. The charge transport layer 4 in which the charge mobility of the first charge transport layer is defined as µ1, the charge mobility of the second charge transport layer is defined as µ2, the charge mobility of the third charge transport layer is defined as µ3, and the layer thickness of these charge transport layers is defined as d1, d2, and d3, respectively, satisfies the following two conditions.

$$\mu1 > \mu2 > \mu3 \tag{1}$$

$$d1 + d2 < d3 \tag{2}$$

For the first charge transport layer, a charge transport material having a higher charge mobility than the materials for the second charge transport layer and the third charge transport layer is selected. The charge transport material can have a mobility of $1.0 \times 10^{-3}$ to $10^{-2}$ cm$^2$/V·s from the viewpoint of reducing the driving voltage. In the case of using such a material having a high charge mobility, charges hole-injected through the first electrode are rapidly transported to the second charge transport layer, to thereby achieve reduction in charge accumulation and suppression of an increase in the driving voltage.

However, the first charge transport layer is formed of the material having a high mobility and hence has a high mobility not only in the direction from the first electrode to the second electrode, but also in directions that intersect with this direction. Thus, charges injected through the first electrode flow also to adjacent organic light-emitting elements, which leads to charge leakage. In the case of charge leakage to adjacent organic light-emitting elements, unintended light emission occurs in the adjacent organic light-emitting elements, which in turn means that the intended color purity is not provided.

On the other hand, for the purpose of reducing charge leakage, in the case of forming the first charge transport layer using a material having a low mobility, charge leakage to adjacent sub pixels is reduced, but an increased voltage needs to be applied for light emission.

Thus, in the organic light-emitting element according to this embodiment, the first charge transport layer is formed of an organic material having a high mobility, and the third charge transport layer is formed of an organic material having a lower mobility than the first charge transport layer. The second charge transport layer is formed of an organic material having a charge mobility that is between the charge mobilities of the first charge transport layer and the third charge transport layer. As a result, charges transported from the first charge transport layer can be efficiently transported to the third charge transport layer having a low mobility. This can be explained on the basis of Maxwell-Wagner effect. Let us consider an element including a pair of electrodes and two organic materials disposed between the electrodes and being different in mobility. In the case of charges injected through one of the electrodes to the organic materials, the change in the charge capacitance in the dielectric in the interface between the layers having a large difference in mobility leads to the current relaxation times (affected by mobility) being considerably different. This in turn leads to charge accumulation in the interface. However, the difference in mobility between the layers can be lowered to thereby lower the difference in current relaxation times to reduce charge accumulation in the interface. As a result, the charges injected through the first electrode are efficiently transported to the light-emitting layer and charge accumulation in the interface is reduced, so that charge leakage to adjacent organic light-emitting elements is less likely to be caused.

On the other hand, the layer thicknesses of the charge transport layers of the organic light-emitting element according to this embodiment satisfy Formula (2) as defined above. For the purpose of only reducing the driving voltage, the first charge transport layer having a high mobility can be formed by having the greatest thickness; however, when the first charge transport layer is formed so as to have the greatest thickness, charge leakage tends to occur. Thus, the total layer thickness of the first charge transport layer and the second charge transport layer can be made less than the layer thickness of the third charge transport layer, so that, while the charge injection ability through the first electrode is maintained, charge leakage to adjacent organic light-emitting elements can be reduced.

Compared with the case of forming the first charge transport layer using an organic material having a low mobility to thereby reduce charge leakage, efficient charge transport to the third charge transport layer can be performed, so that, without an increase in the driving voltage, charge leakage can be reduced. Since charge leakage is reduced, color mixture caused by unintended light emission from adjacent organic light-emitting elements can be reduced.

The second charge transport layer can be formed as a mixture layer of a first charge transport layer material and a third charge transport layer material. The mixing ratio can be changed such that the second charge transport layer has an appropriate charge mobility. For the second charge transport layer, the mixing ratio may be continuously changed or a multilayer film having different mixing ratios can be formed.

Between the first electrode and the first charge transport layer, an electron extraction layer having an electron affinity EA of 5.0 eV or more may be inserted. The electron affinity may be measured on the basis of LUMO. An electron affinity EA of 5.0 eV or more corresponds to a LUMO of −5.0 eV or less. For example, a tetracyanoquinodimethane (TCNQ) derivative or a hexaazatriphenylene derivative (HAT) can be used. Alternatively, an inorganic material such as molybdenum oxide, tungsten oxide, or titanium oxide can be used for the electron extraction layer.

Second Embodiment

Figure 3:
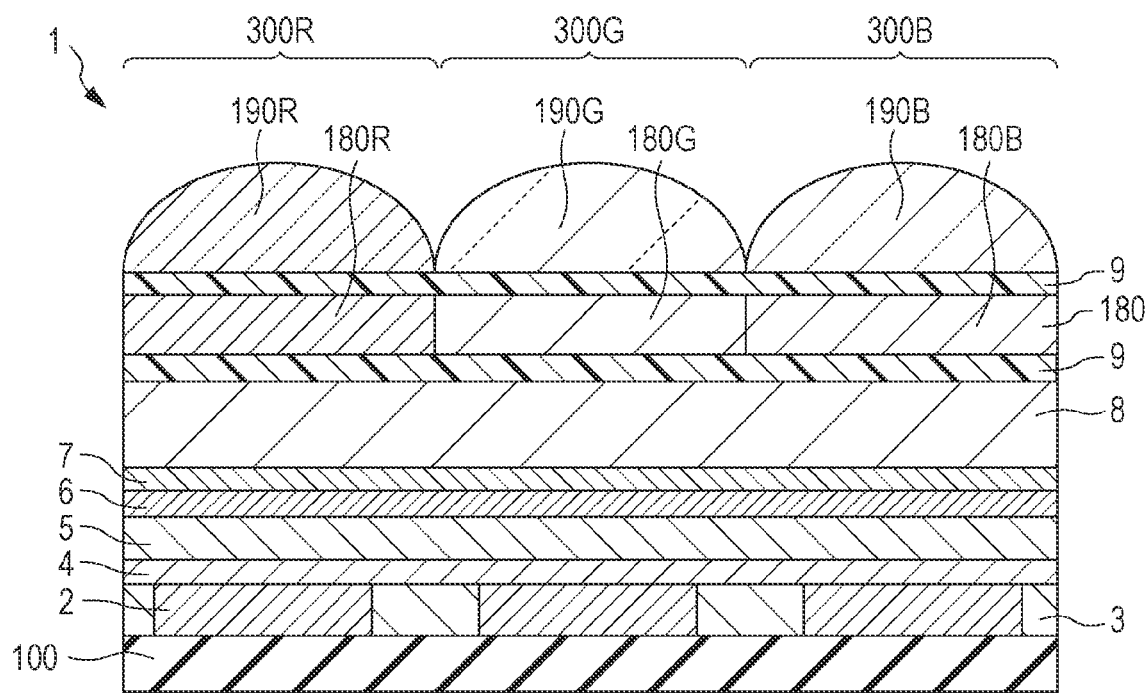
FIG. 3 is a schematic sectional view of a light-emitting device according to an embodiment of the present invention.

FIG. 3 is a schematic sectional view of a light-emitting device according to this embodiment. In this embodiment, the pixel division layer 3 is filled into the grooves between the first electrodes, to form a substantially flat surface. The other configuration is the same as in the first embodiment. Since the substrate surface is substantially flat, short circuits of the organic light-emitting elements due to irregularities in the substrate surface can be reduced.

Third Embodiment

Figure 4:
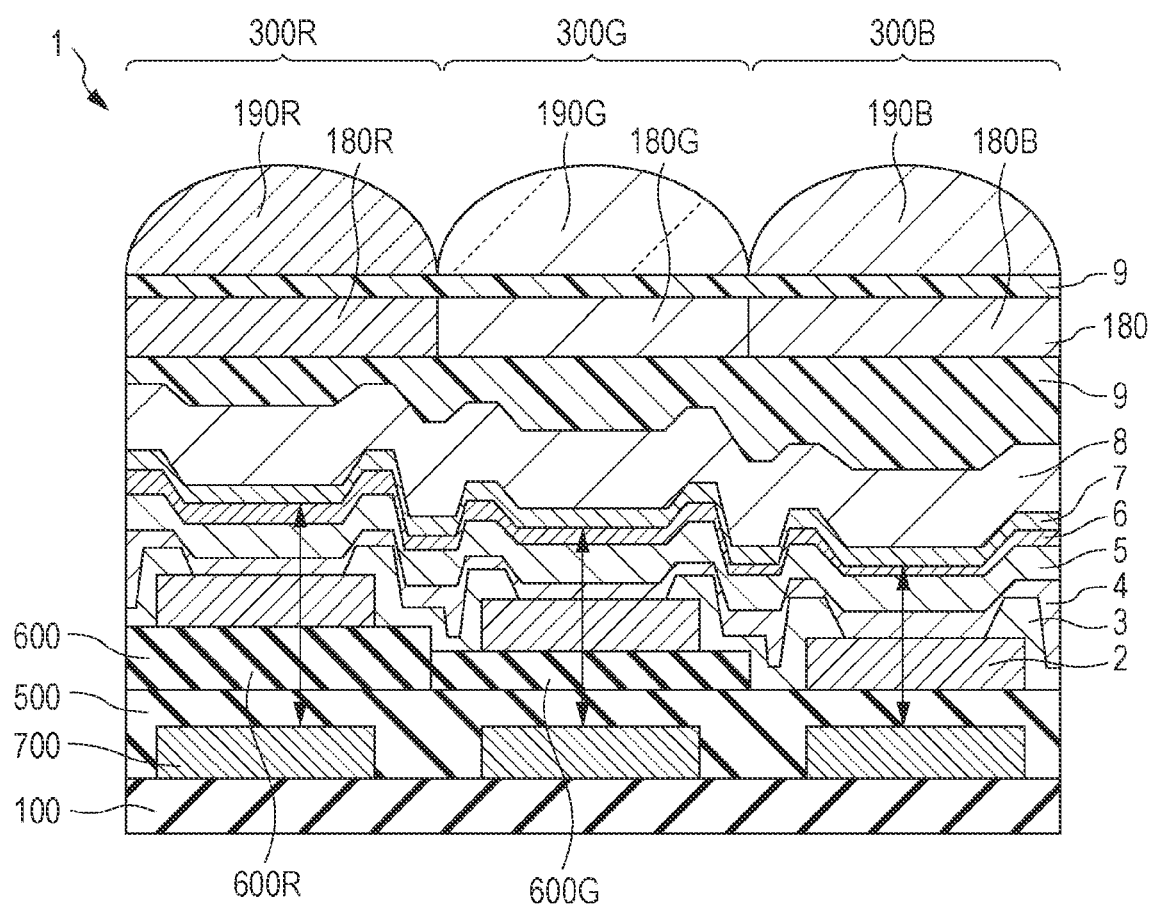
FIG. 4 is a schematic sectional view of a light-emitting device according to an embodiment of the present invention.

FIG. 4 is a schematic sectional view of a light-emitting device according to this embodiment. On a substrate, a reflective layer 700 is formed; on the reflective layer 700, a transparent layer 500 and a transparent layer 600 made of $SiO_2$ are formed; on the transparent layers 500 and 600, a transparent electrode made of, for example, ITO or IZO is formed as a first electrode 2. The first electrode 2 is covered with a pixel division layer 3 so as to have an opening. Except for these features, the organic light-emitting element is disposed as in the first embodiment.

In this embodiment, when the pixel 300R is, for example, a red pixel, the thicknesses of the organic compound layer, the transparent layers 500 and 600, and the first electrode 2 can be adjusted so as to cause optical interference for red. Similarly, when the pixels 300G and 300B are a green pixel and a blue pixel, respectively, an interference design for the emission colors can be provided. Specifically, a first organic light-emitting element and a second organic light-emitting element are disposed on an insulating layer. In the first organic light-emitting element, a reflective layer is disposed between a first electrode and the insulating layer, and a first distance between the reflective layer and a light-emitting layer is set so as to intensify light emitted from the light-emitting layer. In the second organic light-emitting element, a reflective layer is disposed between a first electrode and the insulating layer, and a second distance between the reflective layer and a light-emitting layer is set so as to intensify light emitted from the light-emitting layer. The first distance and the second distance may be different lengths.

The arrows in FIG. 4 indicate the optical path lengths between the reflective layer 700 and the second electrode. The optical path lengths between the reflective layer 700 and the second electrode can each be set to a half wavelength ($\lambda/2$) or one wavelength ($\lambda$) of the desired wavelength. The reflective layer 700 may be electrically connected to the first electrode 2. The reflective layer 700 is electrically connected to, as in the first embodiment, the circuit (not shown) of the insulating layer. Alternatively, the reflective layer 700 may not be electrically connected to the circuit of the insulating layer. In this case, the first electrode can be electrically connected, via, for example, a through-hole, to the circuit of the insulating layer.

In this embodiment, even in the case of a white organic light-emitting element, light in the desired wavelength region being the target of extraction from the sub pixels can be intensified, so that the color purity of the display panel can be improved. A fine mask can be used to paint individually, for each pixel, the light-emitting layer so as to emit light of the desired emission color alone, so that the efficiency of the organic light-emitting element can be further improved and the color purity can be improved.

Fourth Embodiment

The light-emitting device according to this embodiment includes, what is called, a tandem-structure organic light-emitting element in which two or more organic light-emitting elements are formed between the first electrode and the second electrode. In this embodiment, as in the first embodiment, the organic light-emitting element in FIG. 2B is formed until the formation of the electron transport layer. Subsequently, on the electron transport layer 6, a co-evaporated film of, for example, an alkali metal and an electron transport material is formed to form, what is called, an n-type doped electron injection layer.

Subsequently, on the electron injection layer 6, an electron extraction layer, a charge transport layer, a light-emitting layer, and an electron transport layer are formed again. In this case, the electron extraction layer functions as a charge generation layer configured to extract electrons from the charge transport layer and to inject electrons into the first-electrode-side n-type doped electron injection layer. Also in this case, the charge transport layer according to this embodiment is used, so that, charge leakage to adjacent pixels can also be reduced in the second-electrode-side light-emitting element.

Specifically, the light-emitting device according to this embodiment includes an organic light-emitting element including a first electrode, a second electrode, and an organic compound layer disposed between the first electrode and the second electrode, wherein the organic compound layer includes a charge transport layer, a light-emitting layer, an electron extraction layer, an upper charge transport layer, a second light-emitting layer, and a second electrode, wherein these layers are arranged in the above mentioned order from the first electrode. The LUMO of the organic compound contained in the electron extraction layer is lower than the HOMO of the organic compound contained in the electron-extraction-layer-side region of the upper charge transport layer.

The upper charge transport layer includes a fourth charge transport layer, a fifth charge transport layer, and a sixth charge transport layer, wherein the fourth charge transport layer, the fifth charge transport layer, and the sixth charge transport layer, in which the charge mobility of the fourth charge transport layer is defined as $\mu 4$, the charge mobility of the fifth charge transport layer is defined as $\mu 5$, the charge mobility of the sixth charge transport layer is defined as $\mu 6$, and the layer thickness of these layers is defined as d4, d5, and d6, respectively, satisfy the following two conditions.

$$\mu 4 > \mu 5 > \mu 6 \quad (3)$$

$$d4 + d5 < d6 \quad (4)$$

For the fourth charge transport layer, a charge transport material having a higher charge mobility than the materials for the fifth charge transport layer and the sixth charge transport layer is selected. The charge transport material can have a mobility of $1.0 \times 10^{-3}$ to $10^{-2}$ cm$^2$/V·s from the viewpoint of reducing the driving voltage. The material has such a high charge mobility, so that charges hole-injected through the first electrode are rapidly transported to the second charge transport layer and hence charge accumulation can be reduced and an increase in the driving voltage can be suppressed.

The upper charge transport layer satisfying Formulas (3) and (4) above may have a structure including the fourth charge transport layer, the fifth charge transport layer having a lower charge mobility than the fourth charge transport layer, and the sixth hole transport layer having a lower charge mobility than the fourth charge transport layer, wherein the fourth charge transport layer has a layer thickness less than the layer thickness of the fifth charge transport layer and the layer thickness of the sixth hole transport layer.

Stated another way, this embodiment includes the first electrode, the second electrode, and the organic compound layer between the first electrode and the second electrode, wherein the organic compound layer includes a first light-emitting unit, a charge generation region, and a second light-emitting unit. The first light-emitting unit includes a hole transport layer, a light-emitting layer, and an electron transport layer; the second light-emitting unit includes a hole transport layer, a second light-emitting layer, and an electron transport layer. The charge generation region includes an electron extraction layer.

In this embodiment, the organic light-emitting element including the first light-emitting unit and the second light-emitting unit is described. However, the present invention is not limited to this configuration, and a plurality of light-emitting units further including a third light-emitting unit etc. may be disposed.

Configuration of Organic Compound Layer of Organic Light-Emitting Element

Hereinafter, the organic compound layer of the organic light-emitting element according to this embodiment will be described. As long as the organic compound layer of the organic light-emitting element according to this embodiment includes a light-emitting layer, the organic compound layer may be a monolayer or a multilayer structure constituted by a plurality of layers. When the organic compound layer is a multilayer structure constituted by a plurality of layers, the organic compound layer may include, in addition to the light-emitting layer, a hole injection layer, a hole transport layer, an electron blocking layer, a hole-exciton blocking layer, an electron transport layer, or an electron injection layer, for example. The light-emitting layer may be a monolayer or may be a multilayer structure constituted by a plurality of layers.

In the organic light-emitting element according to this embodiment, at least one of such organic compound layers contains an organometallic complex according to this embodiment. Specifically, the organic compound according to this embodiment is contained in any one of the above-described light-emitting layer, hole injection layer, hole transport layer, electron blocking layer, hole-exciton blocking layer, electron transport layer, and electron injection layer, for example. The organic compound according to this embodiment can be contained in the light-emitting layer.

In the organic light-emitting element according to this embodiment, when the organic compound according to this embodiment is contained in the light-emitting layer, the light-emitting layer may be a layer formed of the organic compound according to this embodiment alone, or may be a layer formed of the organometallic complex according to this embodiment and another compound. In such a case where the light-emitting layer is a layer formed of the organometallic complex according to this embodiment and another compound, the organic compound according to this embodiment may be used as the host of the light-emitting layer, may be used as the guest, or may be used as an assist material that can be contained in the light-emitting layer. The host may be a compound accounting for the highest mass ratio among the compounds constituting the light-emitting layer. The guest is a compound that accounts for a lower mass ratio than the host among the compounds constituting the light-emitting layer and that mainly contributes to light emission. The assist material is a compound that accounts for a lower mass ratio than the host among the compounds constituting the light-emitting layer and that assists light emission of the guest. Note that the assist material is also referred to as the second host. The host material can also be referred to as the first compound and the assist material can also be referred to as the second compound.

When the organic compound according to this embodiment is used as the guest of the light-emitting layer, the concentration of the guest relative to the entirety of the light-emitting layer is preferably 0.01 mass % or more and 20 mass % or less, more preferably 0.1 mass % or more and 10 mass % or less.

In addition, as needed, publicly known low-molecular-weight or high-molecular-weight hole injection compounds or hole transport compounds, compounds serving as the host, light-emitting compounds, electron injection compounds, or electron transport compounds, for example, can be used. Hereinafter, examples of these compounds will be described.

Such a hole injection-transport material can be a material having a high hole mobility in order to facilitate injection of holes through the anode and to transport the injected holes to the light-emitting layer. The hole injection-transport material can be a material having a high glass transition temperature in order to suppress deterioration of the film quality such as crystallization in the organic light-emitting element. Examples of the low-molecular-weight or high-molecular-weight material having the hole injection-transport ability include aromatic amine derivatives, carbazole derivatives, furan derivatives, triaryl amine derivatives, aryl carbazole derivatives, phenylenediamine derivatives, stilbene derivatives, phthalocyanine derivatives, porphyrin derivatives, poly(vinylcarbazole), poly(thiophene), and other conductive polymers. Such hole injection-transport materials can also be used for the electron blocking layer.

The following are examples of the compound that can be used as the hole transport material. However, the present invention is not limited to these compounds.

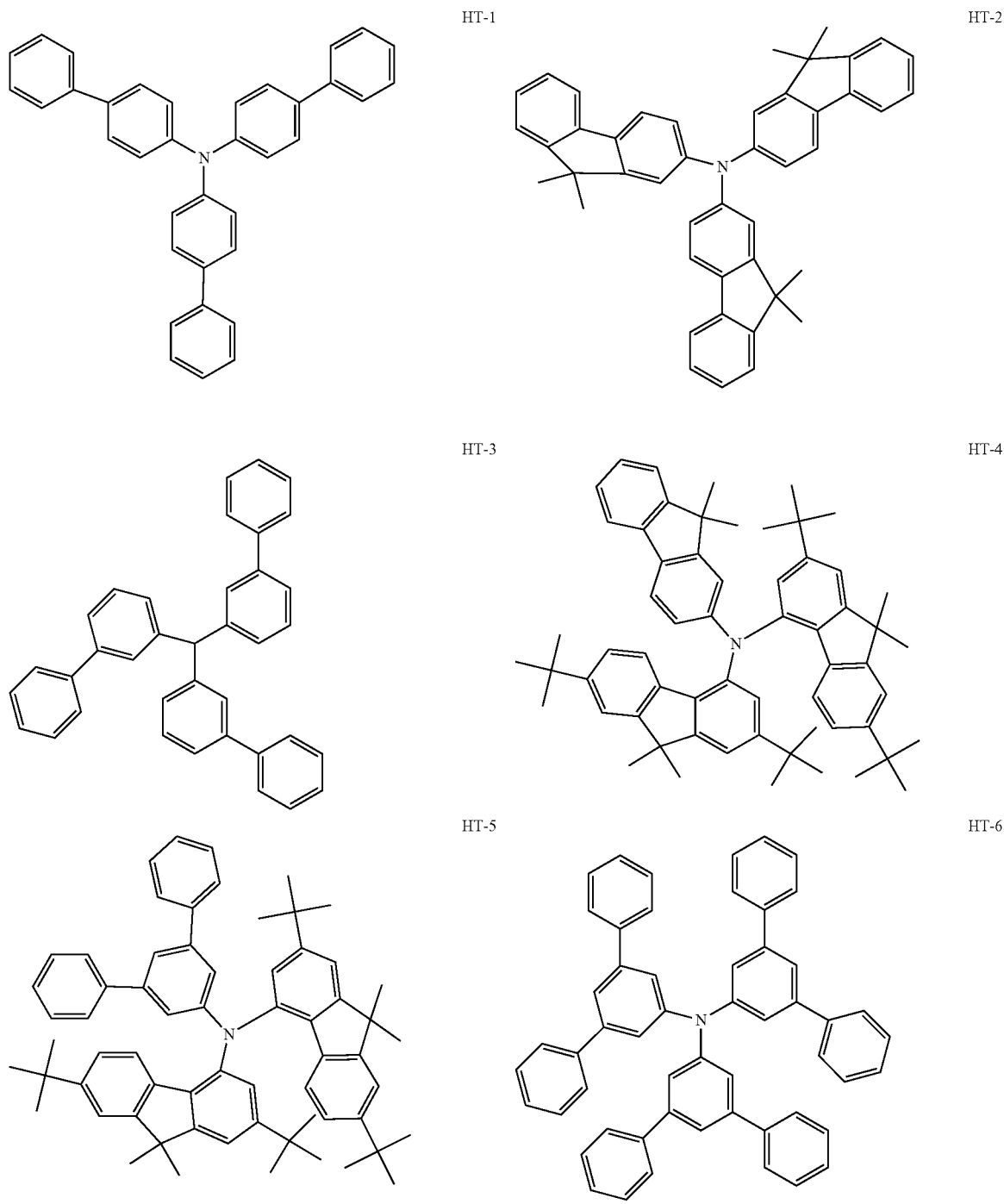

-continued
HT-7
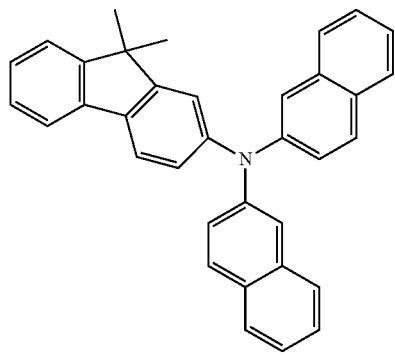
HT-8
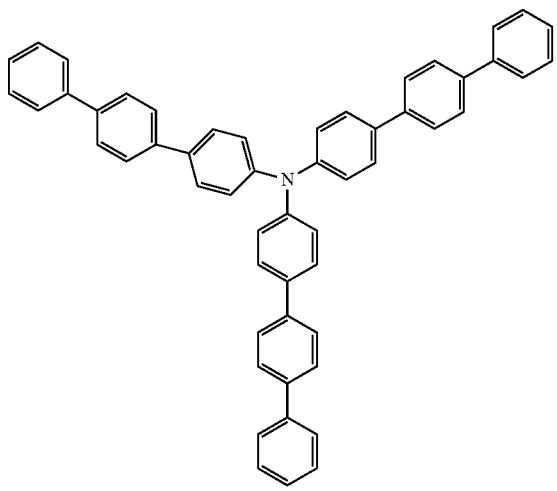
HT-9
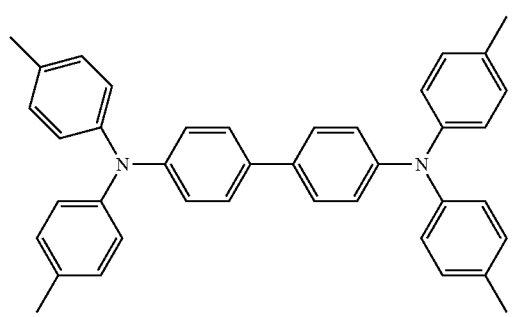
HT-10
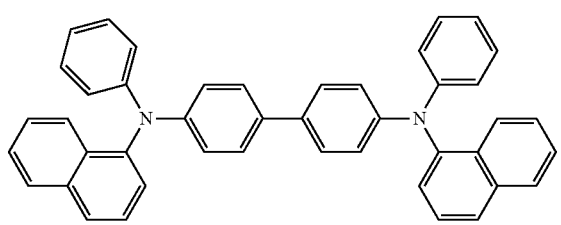
HT-11
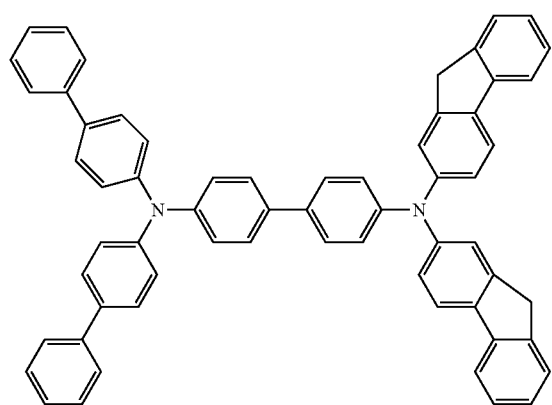
HT-12
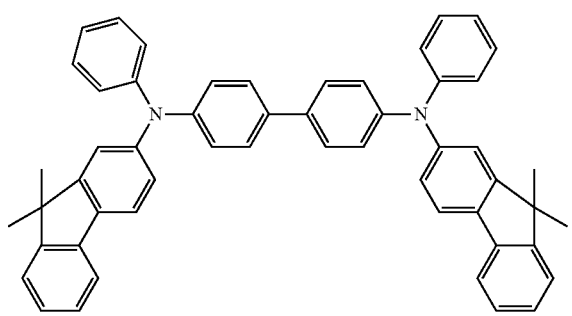

HT-13
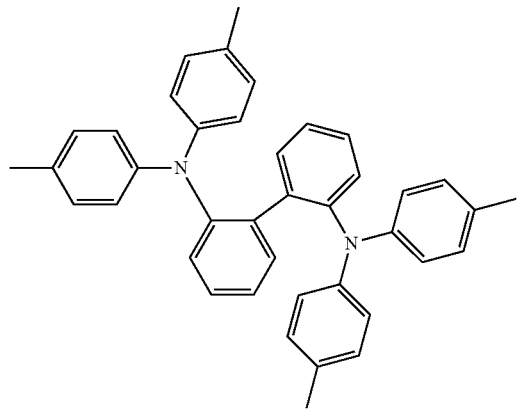
HT-14
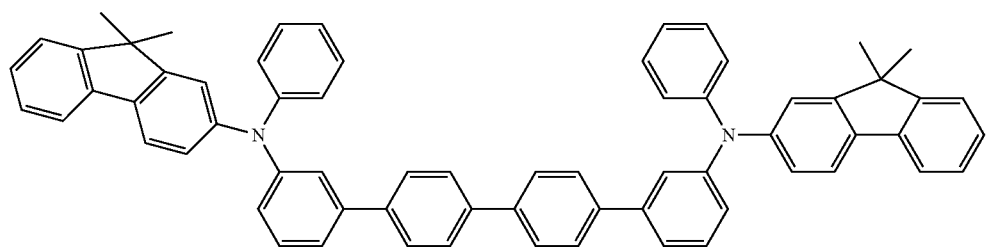
HT-15
HT-16
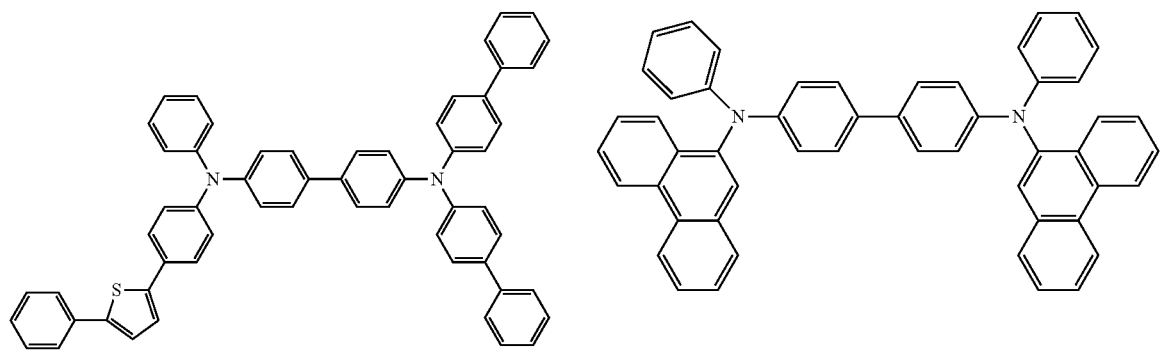
HT-17
HT-18
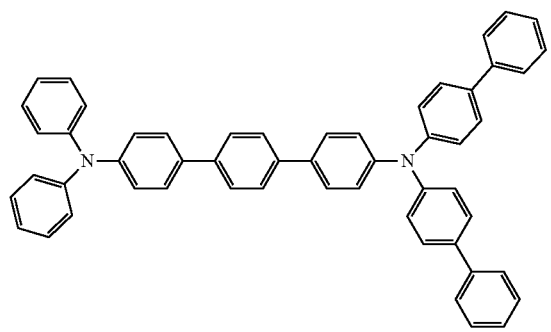
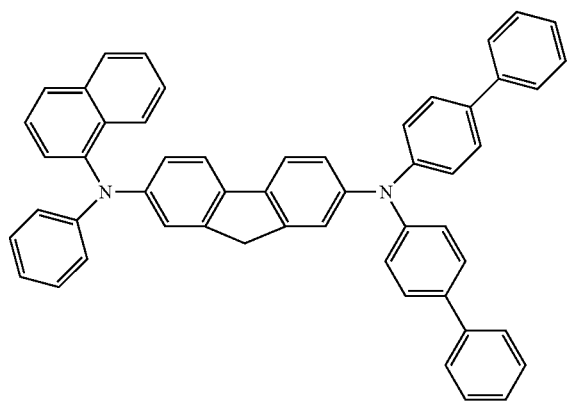

-continued
HT-19
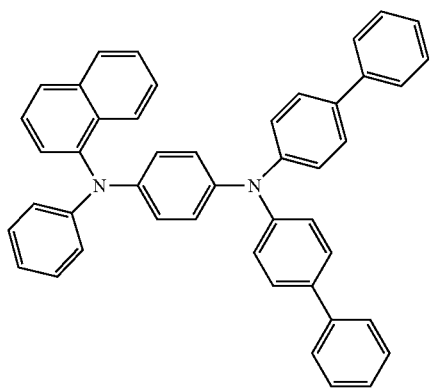
HT-20
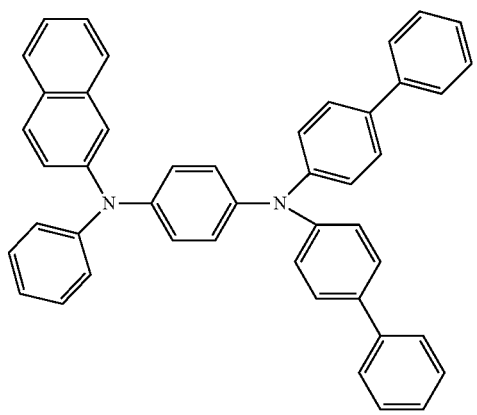
HT-21
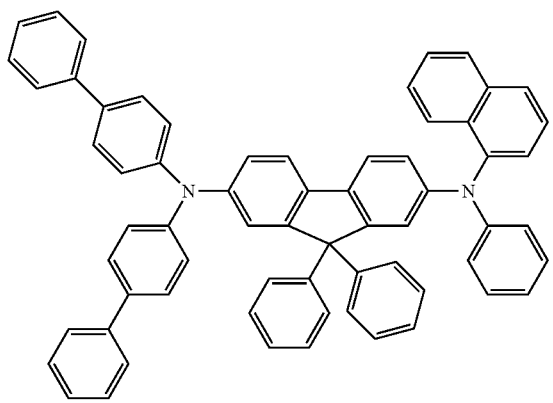
HT-22
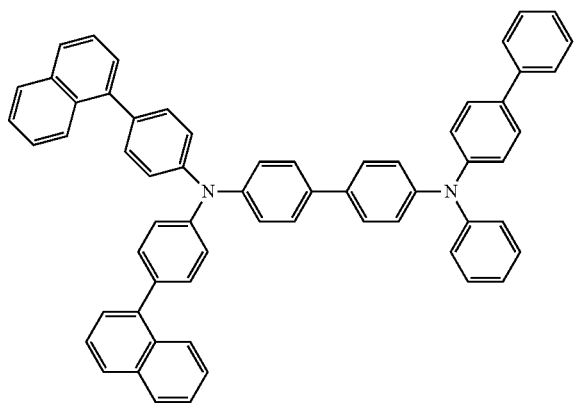
HT-23
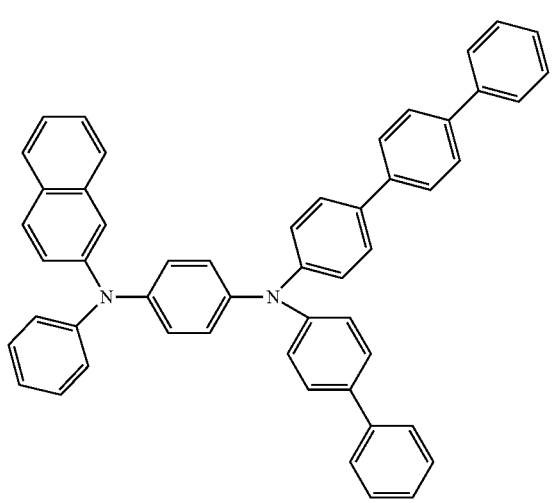
HT-24
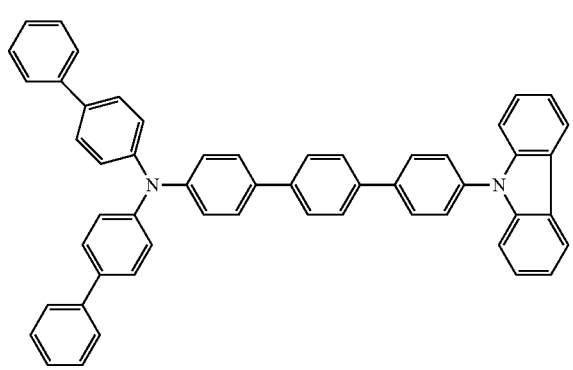

-continued
HT-25
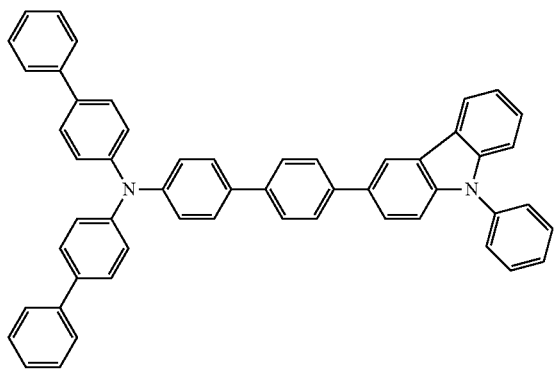
HT-26
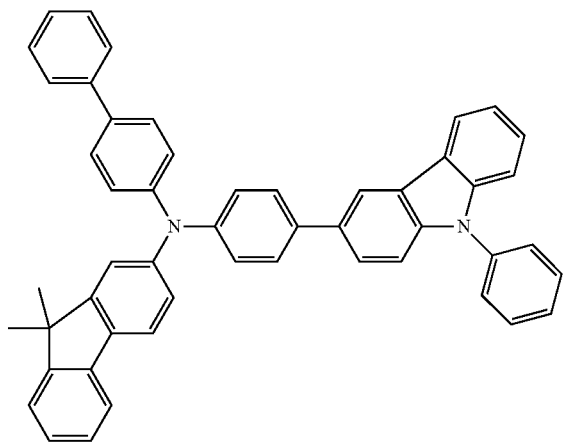
HT-27
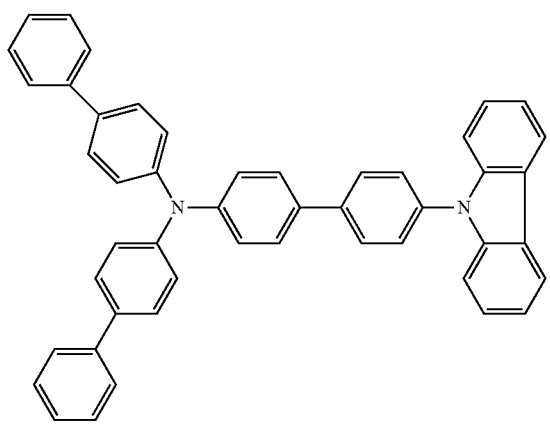
HT-28
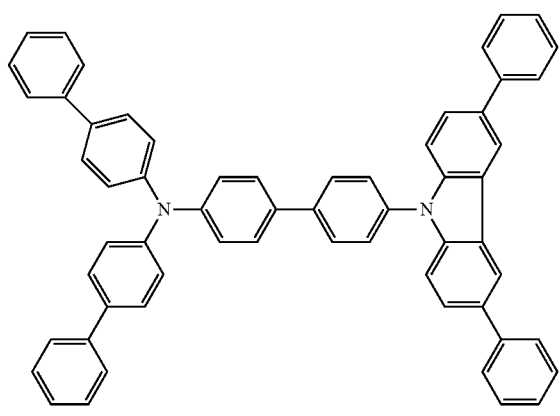
HT-29
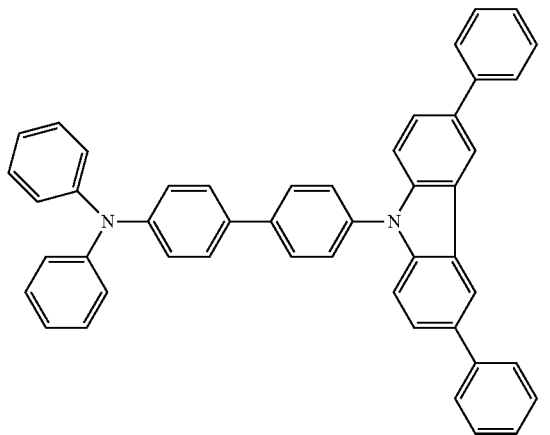
HT-30
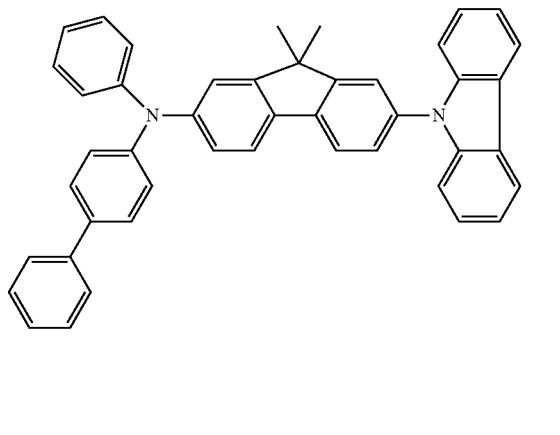
HT-31
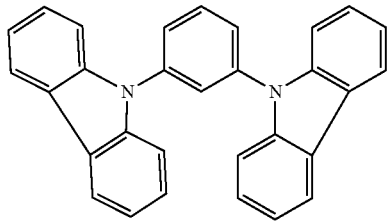
HT-32
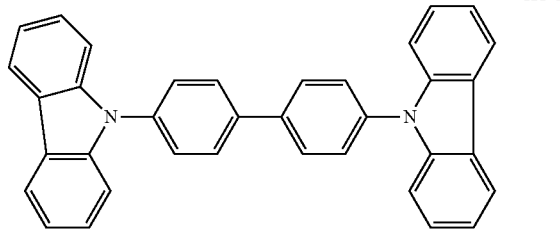

-continued
HT-33
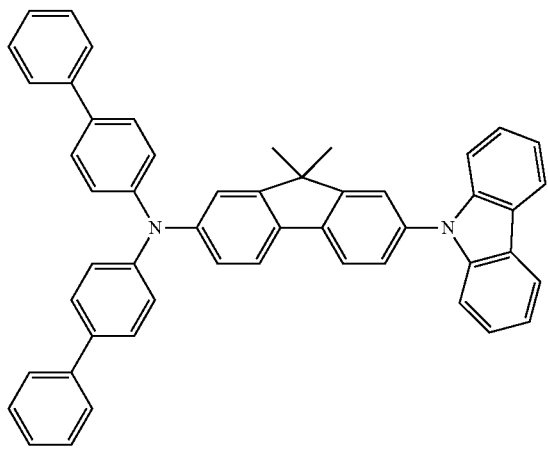
HT-34
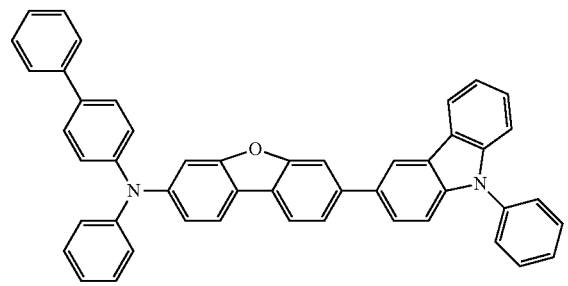
HT-35
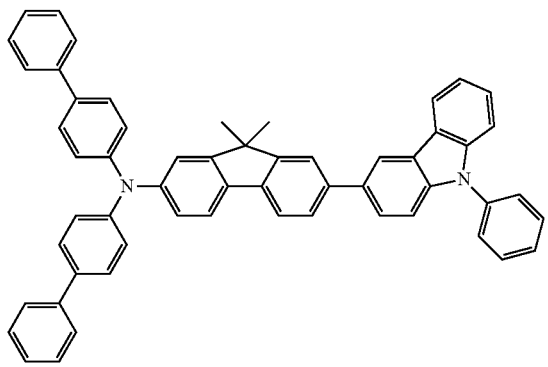
HT-36
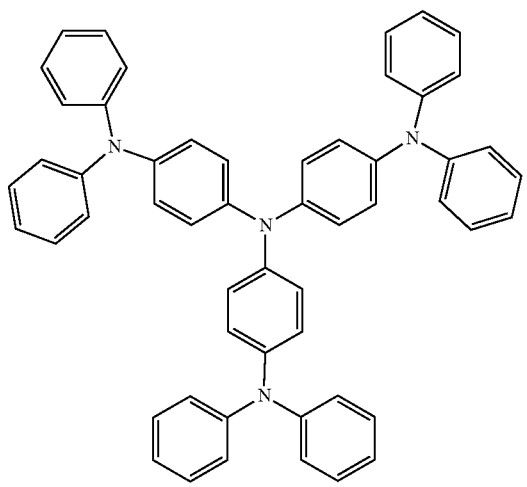
HT-37
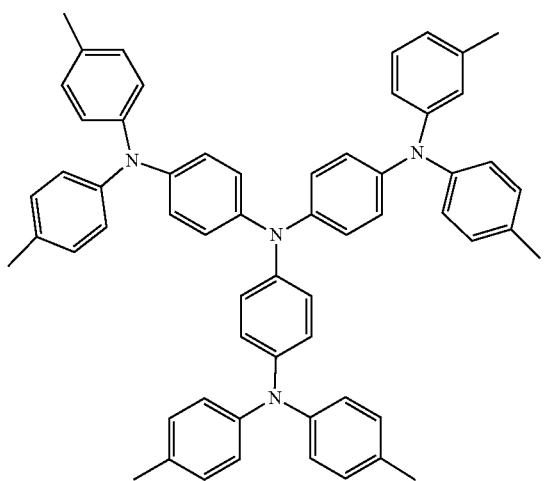
HT-38
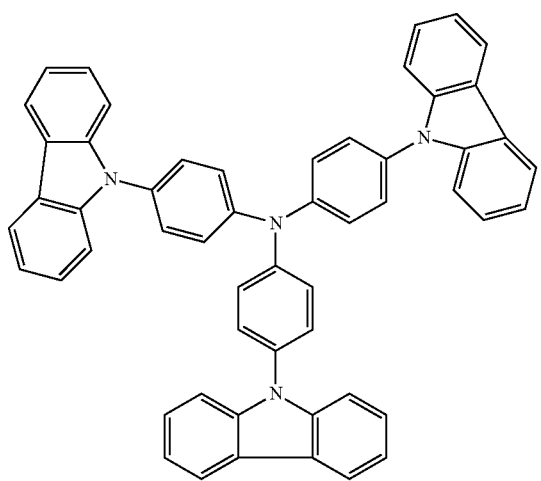

HT-39

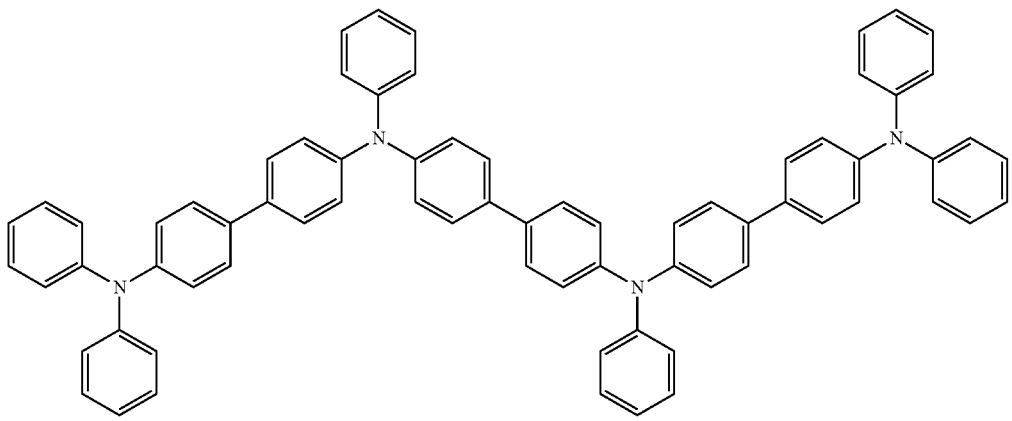

Of the above-described hole transport materials, aryl amines having two nitrogen atoms that are HT19 to HT33 and HT35 can be used.

Examples of the light-emitting material mainly contributing to the light-emitting function include condensed-ring compounds (such as fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinato)aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

The light-emitting material can be a hydrocarbon compound from the viewpoint of reducing a decrease in the light emission efficiency due to formation of exciplex or a decrease in the color purity due to change in the light emission spectrum of the light-emitting material due to formation of exciplex.

The light-emitting material can be a condensed polycyclic compound including a five-membered ring from the viewpoint of having a high ionization potential and hence being less likely to be oxidized, to provide an element having high durability and long longevity.

Examples of the host of the light-emitting layer or the light-emission assist material contained in the light-emitting layer include, in addition to aromatic hydrocarbon compounds or derivatives thereof, carbazole derivatives, dibenzofuran derivatives, dibenzothiophene derivatives, organic aluminum complexes such as tris(8-quinolinato)aluminum, and organic beryllium complexes.

The host material can be a hydrocarbon compound from the viewpoint that the compound according to this embodiment becomes more likely to trap electrons or holes and hence the efficiency is considerably increased. The hydrocarbon compound is a compound composed only of carbon and hydrogen.

The electron transport material can be freely selected from materials that can transport electrons injected through the cathode to the light-emitting layer, and is selected on the basis of, for example, the balance with the hole mobility of the hole transport material. Examples of the material having the electron transport ability include oxadiazole derivatives, oxazole derivatives, pyrazine derivatives, triazole derivatives, triazine derivatives, quinoline derivatives, quinoxaline derivatives, phenanthroline derivatives, organic aluminum complexes, and condensed-ring compounds (such as fluorene derivatives, naphthalene derivatives, chrysene derivatives, and anthracene derivatives). Such electron transport materials can also be used for the hole blocking layer.

The electron injection material can be freely selected from materials that can easily inject electrons through the cathode, and is selected on the basis of, for example, the balance with the hole injection ability. Examples include, as organic compounds, n-type dopants and reducing dopants. Examples include alkali-metal-containing compounds such as lithium fluoride, lithium complexes such as lithium quinolinol, benzoimidazolidene derivatives, imidazolidene derivatives, fulvalene derivatives, and acridine derivatives. Such materials can also be used together with the above-described electron transport materials.

Configuration of Organic Light-Emitting Element

The organic light-emitting element is provided by forming, on a substrate, an insulating layer, a first electrode, an organic compound layer, and a second electrode. On the cathode, for example, a protective layer, a color filter, or a microlens may be disposed.

In the case of forming the color filter, a planarization layer may be formed between the protective layer and the color filter. The planarization layer may be formed of acrylic resin, for example. The same applies to a case of forming a planarization layer between the color filter and the microlens.

Substrate

The substrate may be a quartz substrate, a glass substrate, a silicon wafer, a resin substrate, or a metal substrate, for example. On the substrate, a switching element such as a transistor or wiring may be disposed, which may be overlain by an insulating layer. The insulating layer may be formed of any material as long as a contact hole can be formed so as to allow formation of wiring to the first electrode and insulation from unconnected wiring is ensured. Examples of the material include resins such as polyimide, silicon oxide, and silicon nitride.

In the insulating layer, a driving circuit constituted by a transistor for driving the organic light-emitting element is disposed, and the first electrode and the second electrode are electrically connected to the driving circuit (not shown). The insulating layer 100 is disposed on the substrate. The substrate may be a glass substrate or a silicon substrate, for example. The insulating layer may be a resin layer disposed on a glass substrate or an oxide film formed on a silicon substrate by oxidizing the silicon.

Electrodes

As the electrodes, a pair of electrodes can be used. The pair of electrodes may be an anode and a cathode.

In the case of applying an electric field in the emission direction of the organic light-emitting element, the electrode at the higher potential is the anode, and the other electrode is the cathode. In other words, the electrode configured to supply holes to the light-emitting layer is the anode, and the electrode configured to supply electrons is the cathode. The electrode disposed for each of the sub pixels may also be referred to as a sub-pixel electrode.

The material forming the anode can be a material having a work function as high as possible. Examples include elemental metals such as gold, platinum, silver, copper, nickel, palladium, cobalt, selenium, vanadium, and tungsten, mixtures containing the foregoing, alloys of combinations of the foregoing, and metal oxides such as tin oxide, zinc oxide, indium oxide, indium tin oxide (ITO), and indium zinc oxide. Other examples include conductive polymers such as polyaniline, polypyrrole, and polythiophene.

Such electrode substances may be used alone or in combination of two or more thereof. The anode may have a monolayer structure or may have a multilayer structure.

The sub-pixel electrode is formed of a metal having a high reflectance. Specifically, the sub-pixel electrode can be formed of a high-reflectance metal such as Al or Ag or an alloy thereof. The sub-pixel electrode may be formed so as to have a multilayer structure including a layer of a high-work-function metal or metal oxide such as Ti, TiN, Mo, W, ITO, or IZO. In particular, the surface in the pixel-division-layer opening of the reflective electrode layer can be covered with such a high-work-function metal, to reduce surface oxidation of the high-reflectance metal to reduce the driving voltage of the organic light-emitting element. Even when the surface of the sub-pixel electrode is not covered with the high-work-function metal, a process for removing the oxide film from the surface in the pixel-division-layer opening of the sub-pixel electrode can be performed and subsequently an organic layer can be formed to thereby reduce the increase in the voltage of the organic light-emitting element.

Thus, the second electrode is formed as a transparent or semi-transparent electrode, to provide a structure in which light is extracted to a side opposite from the substrate. The second electrode may be a transparent conductive film formed of, for example, ITO or IZO, or may be a Ag alloy thin film. The organic compound layer is formed of an organic material containing a light-emitting substance and a charge transport substance.

The material forming the second electrode (cathode) can be a material having a low work function. Examples of the material include alkali metals such as lithium, alkaline-earth metals such as calcium, elemental metals such as aluminum, titanium, manganese, silver, lead, and chromium, and mixtures of the foregoing. Other examples include alloys of combinations of these elemental metals, such as magnesium-silver, aluminum-lithium, aluminum-magnesium, silver-copper, and zinc-silver.

Other examples include metal oxides such as indium tin oxide (ITO). Such electrode substances may be used alone or in combination of two or more thereof. The cathode may have a monolayer configuration or a multilayer configuration. As the second electrode material, silver, which is a low resistance material, can be used; in order to reduce aggregation of silver, silver alloys can be used. As long as aggregation of silver is reduced, the alloy ratio is not limited. For example, the ratio of silver:other metal may be 1:1 or 3:1.

The cathode may be formed as a conductive layer of an oxide such as ITO to provide a top emission element, or may be formed as a reflective electrode of, for example, aluminum (Al) to provide a bottom emission element. The cathode is not limited to the above mentioned formations and may be formed using any other techniques known in the art. Furthermore, at the interface between the electron transport layer and the second electrode, an electron injection layer can be formed of a publicly known material such as a low-work-function metal (Li, Cs, Ca, or Yb) or a low-work-function metal compound (LiF, CsF, MgF, or NaF). The method of forming the cathode is not limited to a particular method and any method known to the skilled person may be used; for example, a direct-current or an alternating-current sputtering method can be used because a high film coverage is achieved and a lowered resistance tends to be provided.

In the case of forming a semi-transparent electrode, a metal that transmits a portion of incident light and reflects a portion of the light is used. A metal layer having a sufficiently small thickness can be formed to provide a semi-transparent electrode. For example, a silver layer having a thickness of about 10 nm can be formed to provide a semi-transparent electrode.

Pixel Division Layer

The pixel division layer is formed of a silicon nitride (SiN) film, a silicon oxynitride (SiON) film, or a silicon oxide (SiO) film formed by a chemical vapor deposition process (CVD process).

In order to increase the in-plane resistance of the organic compound layer, the organic compound layer, particularly the hole transport layer, can be formed so as to have a small layer thickness on the side wall of the pixel division layer. Specifically, the tapering angle of the side wall of the pixel division layer or the layer thickness of the pixel division layer can be increased, to increase vignetting during vapor deposition, to thereby provide a small layer thickness on the side wall.

On the other hand, for the pixel division layer, the side-wall tapering angle of the pixel division layer or the layer thickness of the pixel division layer can be adjusted so as not to form pores in the protective layer formed thereon. Since the protective layer is formed without pores, the probability of occurrence of defects in the protective layer can be reduced. Since the probability of occurrence of defects in the protective layer is reduced, degradation such as generation of dark spots or occurrence of connection failure of the second electrode can be reduced, which in turn leads to increased reliability.

In this embodiment, even when the side-wall tapering angle of the pixel division layer is not steep, charge leakage to adjacent pixels can be effectively suppressed. As a result of our studies, it has been found that, as long as the tapering angle is in the range of 60° or more and 90° or less, the charge leakage can be sufficiently reduced. The pixel division layer can have a layer thickness of 10 nm or more and 150 nm or less. Alternatively, even when the pixel electrode is formed alone without the pixel division layer, similar advantages are provided. However, in this case, the pixel electrode can be formed so as to have a layer thickness that is half or less of that of the organic layer, or the pixel electrode can be formed so as to have forward-tapered edge portions of less than 60° from the viewpoint of reducing short circuits of the organic light-emitting element.

Also in a case where the first electrode is formed as a cathode and the second electrode is formed as an anode, electron transport materials and charge transport layers satisfying Conditional formulas (1) and (2) and a light-emitting layer on the charge transport layers can be formed, so that high color gamut and low-voltage driving can be achieved.

Protective Layer

On the second electrode, a protective layer may be disposed. For example, on the second electrode, a glass having a desiccant can be bonded, to reduce entry of, for example, water into the organic compound layer, to reduce occurrence of displaying failure. In another embodiment, on the cathode, a passivation film of, for example, silicon nitride may be disposed, to reduce entry of, for example, water into the organic compound layer. For example, the cathode formed in a vacuum may be transported, in the vacuum, to another chamber, and a CVD process may be performed to form a silicon nitride film having a thickness of 2 µm as a protective layer. After the film formation by the CVD process, an atomic layer deposition process (ALD process) may be performed to form a protective layer. The material of the film in the ALD process is not limited and examples include silicon nitride, silicon oxide, and aluminum oxide. On the film formed by the ALD process, a film of silicon nitride may be further formed by a CVD process. The film formed by the ALD process may have a thickness less than the film formed by the CVD process. Specifically, the film formed by the ALD process may have a thickness that is 50% or less or 10% or less than the thickness of the film formed by the CVD process.

For the protective layer, a layer may be formed using the above-described transparent inorganic material and can be planarized by chemical mechanical polishing (CMP), for example.

Color Filter

On the protective layer, a color filter may be disposed. For example, a color filter formed on another substrate in accordance with the size of the organic light-emitting element may be bonded to the substrate having the organic light-emitting element. Alternatively, on the above-described protective layer, a color filter may be formed by patterning using photolithography. The color filter may be formed of a polymer.

Planarization Layer

Between the color filter and the protective layer, a planarization layer may be disposed. The planarization layer is disposed for the purpose of reducing the irregularities of the underlying layer. In order not to limit the purpose, the planarization layer may also be referred to as a material resin layer. The planarization layer may be formed of a low-molecular-weight or high-molecular-weight organic compound, and can be formed of a high-molecular-weight organic compound.

Such planarization layers may be disposed over and under the color filter, and may be the same or different in constituent material. Specific examples of the material include polyvinylcarbazole resin, polycarbonate resin, polyester resin, ABS resin, acrylic resin, polyimide resin, phenol resin, epoxy resin, silicone resin, and urea resin.

Microlens

The organic light-emitting device may include, on its emission side, an optical member such as a microlens. The microlens may be formed of acrylic resin or epoxy resin, for example. The microlens may be used for the purpose of increasing the amount of light extracted from the organic light-emitting device and controlling the direction of the extracted light. The microlens may have a hemispheric shape. When the microlens has a hemispheric shape, of the tangents touching the hemisphere, a tangent extends parallel to the insulating layer, and the point of contact of the tangent and the hemisphere is the uppermost point of the microlens. The uppermost point of the microlens can also be similarly determined in any sectional view. Specifically, in a sectional view, of the tangents touching the semicircle of the microlens, a tangent extends parallel to the insulating layer, and the point of contact of the tangent and the semicircle is the uppermost point of the microlens.

The midpoint of the microlens can also be defined. In a section of microlenses, a line segment extending from the end point of an arc shape to the end point of another arc shape is imagined, and the midpoint of the line segment can be referred to as the midpoint of the microlens. The sections used for determining the uppermost point and the midpoint may be sections perpendicular to the insulating layer.

The microlens includes a first surface having a convex portion and a second surface opposite from the first surface. The second surface can be disposed closer to the function layer than the first surface. In order to provide such a configuration, the microlens needs to be formed on the light-emitting device. When the function layer is an organic layer, processes involving high temperatures can be avoided in the production steps. In the case of providing a configuration in which the second surface is disposed closer to the function layer than the first surface, all the organic compounds constituting the organic layer have glass transition temperatures of preferably 100° C. or more, more preferably 130° C. or more.

Opposite Substrate

On the planarization layer, an opposite substrate may be disposed. The opposite substrate is disposed at a position opposite the above-described substrate, and hence is referred to as an opposite substrate. The material forming the opposite substrate may be the same as in the above-described substrate. When the above-described substrate is referred to as a first substrate, the opposite substrate may be referred to as a second substrate.

Organic Layer

An organic compound layer (a hole injection layer, a hole transport layer, an electron blocking layer, a light-emitting layer, a hole blocking layer, an electron transport layer, or an electron injection layer, for example) of the organic light-emitting element according to an embodiment of the present invention is formed in the following manner.

The organic compound layer of the organic light-emitting element according to an embodiment of the present invention may be formed by a dry process such as a vacuum evaporation process, an ion plating process, sputtering, or a plasma process. Instead of the dry process, a wet process of dissolving the material in an appropriate solvent and forming a layer by a publicly known application process (such as spin-coating, dipping, a casting process, a LB process, or an ink jet process) may be performed.

In such a case of performing, for example, the vacuum evaporation process or the solution application process to form the layer, the layer is less likely to undergo, for example, crystallization and has high stability over time. In the case of performing the application process to form the film, the solution may be combined with an appropriate binder resin to form the film.

Non-limiting examples of the binder resin include polyvinylcarbazole resin, polycarbonate resin, polyester resin, ABS resin, acrylic resin, polyimide resin, phenol resin, epoxy resin, silicone resin, and urea resin.

Such binder resins may be used alone as a homopolymer or a copolymer or in combination of two or more thereof. In addition, as needed, publicly known additives such as a plasticizer, an antioxidant, or an ultraviolet absorbent may be used.

Pixel Circuit

The light-emitting device may include a pixel circuit connected to a light-emitting element. The pixel circuit may be an active-matrix circuit configured to control independently emission of each of the first light-emitting element and the second light-emitting element. The active-matrix circuit may be a voltage programming circuit or a current programming circuit. The driving circuit has a pixel circuit for each pixel. Such a pixel circuit may include a light-emitting element, a transistor configured to control the emission luminance of the light-emitting element, a transistor configured to control the emission timing, a capacitor configured to keep the gate voltage of the transistor configured to control the emission luminance, and a transistor for connection, not via the light-emitting element, to GND.

The light-emitting device includes a display region and a peripheral region disposed around the display region. The display region includes a pixel circuit and the peripheral region includes a display control circuit. The transistor constituting the pixel circuit may have a mobility lower than the mobility of the transistor constituting the display control circuit.

The current-voltage characteristics of the transistor constituting the pixel circuit may have a gradient smaller than the gradient of the current-voltage characteristics of the transistor constituting the display control circuit. The gradient of the current-voltage characteristics can be measured on the basis of, what is called, Vg-Ig characteristics.

The transistor constituting the pixel circuit is a transistor connected to a light-emitting element such as the first light-emitting element.

Pixels

The organic light-emitting device includes a plurality of pixels. The pixels include sub pixels configured to individually emit rays of colors different from each other. The sub pixels may individually have emission colors such as R, G, and B.

In such a pixel, a region also referred to as a pixel opening is configured to emit light. This region is the same as the first region.

The pixel opening may have a size of 15 µm or less, or 5 µm or more. More specifically, examples of the size include 11 µm, 9.5 µm, 7.4 µm, and 6.4 µm.

The intervals of the sub pixels may be 10 µm or less; specific examples include 8 µm, 7.4 µm, 6.4 µm, or 5 µm or less.

The pixels may have, in plan view, a publicly known arrangement form such as the stripe arrangement, the delta arrangement, the PenTile arrangement, or the Bayer arrangement. The plan-view shape of the sub pixels may be any publicly known shape such as a quadrangular shape such as a rectangular shape or a rhombic shape, or a hexagonal shape. It is appreciated that shapes that are not exactly rectangles, but are similar to rectangles are also regarded as rectangles. The shape of the sub pixels and the pixel array can be used in combination.

Application of Organic Light-Emitting Element According to an Embodiment of the Present Invention An organic light-emitting element according to an embodiment of the present invention can be used as a constituent member for a display apparatus or an illumination apparatus, and is also applicable to, for example, the exposure light source of an electrophotographic image-forming apparatus, the backlight of a liquid crystal display apparatus, or a light-emitting device in which a white light source is equipped with a color filter.

The display apparatus may be an image information processing apparatus including an image input section configured to input image information from, for example, an area CCD, a linear CCD, or a memory card, and an information processing section configured to process the inputted information, and configured to display the inputted image on a display unit.

An image pickup apparatus or an ink jet printer may have a display unit having a touch panel function. The operation type of this touch panel function may be an infrared type, an electrostatic capacitance type, a resistive film type, or an electromagnetic induction type. The type of touch panel is not limited to the above and may be any commonly known type of touch panel. The display apparatus may be used as a display unit of a multifunctional printer.

Figure 5:
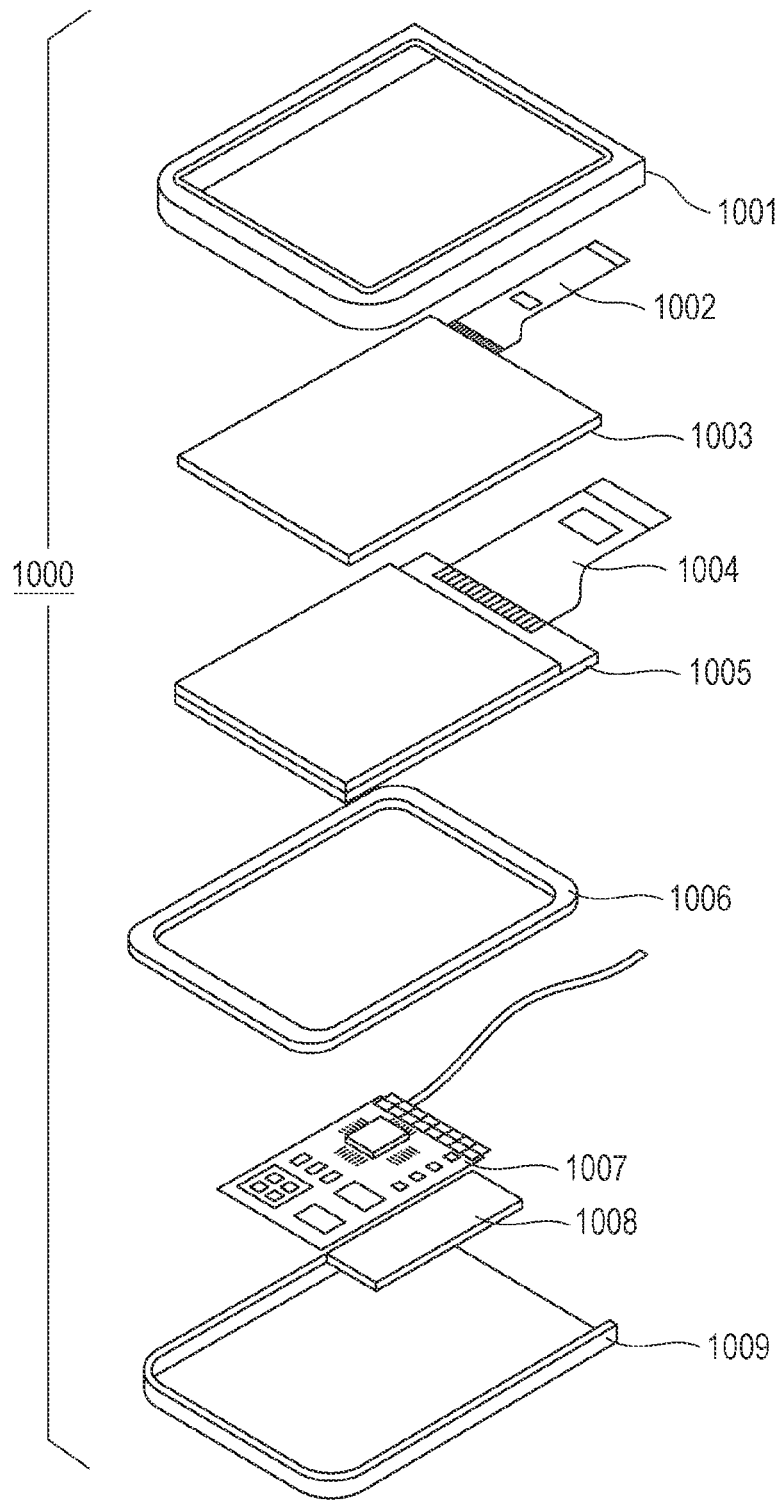
FIG. 5 is a schematic view of an example of a display apparatus according to an embodiment of the present invention.

FIG. 5 is a schematic view of an example of a display apparatus according to this embodiment. A display apparatus 1000 may include, between an upper cover 1001 and a lower cover 1009, a touch panel 1003, a display panel 1005, a frame 1006, a circuit substrate 1007, and a battery 1008. To the touch panel 1003 and the display panel 1005, flexible printed circuit FPCs 1002 and 1004 are respectively connected. On the circuit substrate 1007, transistors are formed by printing. The battery 1008 may not be installed when the display apparatus is not a mobile apparatus. When the display apparatus is a mobile apparatus, the battery 1008 may be installed in another position.

The display apparatus according to this embodiment may include red, green, and blue color filters. The red, green, and blue color filters may be arranged in the delta pattern.

The display apparatus according to this embodiment may be used as a display unit of a mobile terminal. In this case, the display apparatus may have both of the displaying function and the operation function. Examples of the mobile terminal include mobile phones such as smartphones, tablets, and head-mounted displays.

A display apparatus according to this embodiment may be used as a display unit of an image pickup apparatus including an optical unit including a plurality of lenses and an image pickup element configured to receive light having passed through the optical unit. The image pickup apparatus may include a display unit configured to display information obtained by the image pickup element. The display unit may be a display unit exposed outside of the image pickup apparatus, or a display unit disposed within the finder. The image pickup apparatus may be a digital camera or a digital video camera.

Figure 6A:
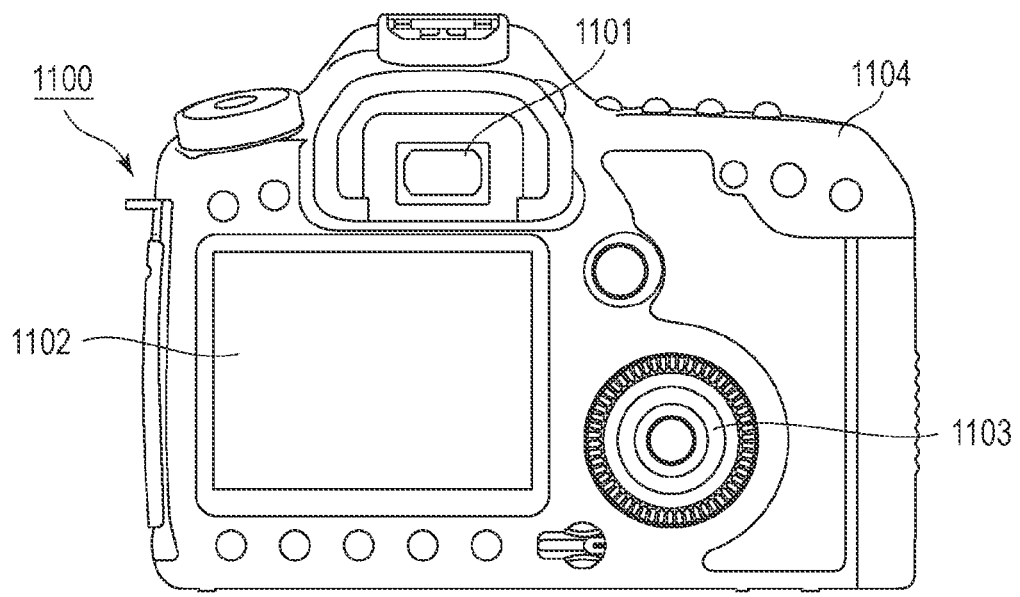
FIG. 6A is a schematic view of an example of an image pickup apparatus according to an embodiment.

FIG. 6A is a schematic view of an example of an image pickup apparatus according to this embodiment. An image pickup apparatus 1100 may include a view finder 1101, a rear surface display 1102, an operation unit 1103, and a housing 1104. The view finder 1101 may include the display apparatus according to this embodiment. In this case, the display apparatus may display not only an image to be captured, but also, for example, environmental information and image capture instructions. Examples of the environmental information include the intensity of external light, the orientation of external light, the moving speed of the subject, and the probability that the subject may hide behind an obstacle.

Since the timing suitable for capturing an image lasts for a very short period, the information is desirably displayed with minimum delay. Thus, a display apparatus employing an organic light-emitting element according to an embodiment of the present invention can be used because the organic light-emitting element responds at a high speed. The display apparatus employing the organic light-emitting element can be more suitably used for such image pickup apparatuses required to display images at high speed than for liquid crystal display apparatuses.

The image pickup apparatus 1100 includes an optical unit (not shown). The optical unit includes a plurality of lenses and is configured to form an image in the image pickup element contained within the housing 1104. The plurality of lenses can be adjusted in terms of relative positions, to thereby adjust the focus. This operation can also be performed automatically. The image pickup apparatus may also be referred to as a photoelectric conversion apparatus. The photoelectric conversion apparatus may include, instead of an image pickup mode of capturing images in succession, image pickup modes such as a mode of detecting the difference from the previous image and a mode of extracting images from continuously recorded images.

Figure 6B:
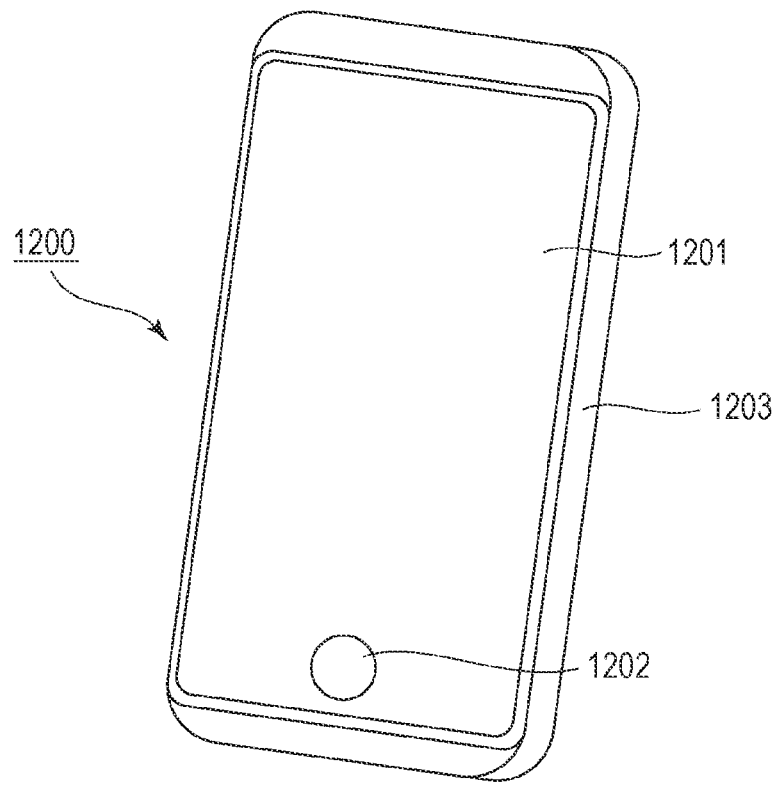
FIG. 6B is a schematic view of an example of an electronic apparatus according to an embodiment of the present invention.

FIG. 6B is a schematic view of an example of an electronic apparatus according to this embodiment. An electronic apparatus 1200 includes a display unit 1201, an operation unit 1202, and a housing 1203. The housing 1203 may include circuits, a printed substrate including the circuits, a battery, and a communication unit. The operation unit 1202 may be a button or a touch-panel-type sensor unit. The operation unit may be a biometric unit configured to scan a fingerprint for unlocking, for example. Such an electronic apparatus including a communication unit can also be referred to as a communication apparatus. The electronic apparatus may further include a lens and an image pickup element to thereby have a camera function. The images captured by the camera function are displayed on the display unit. Examples of the electronic apparatus include smartphones and notebook computers.

Figure 7A:
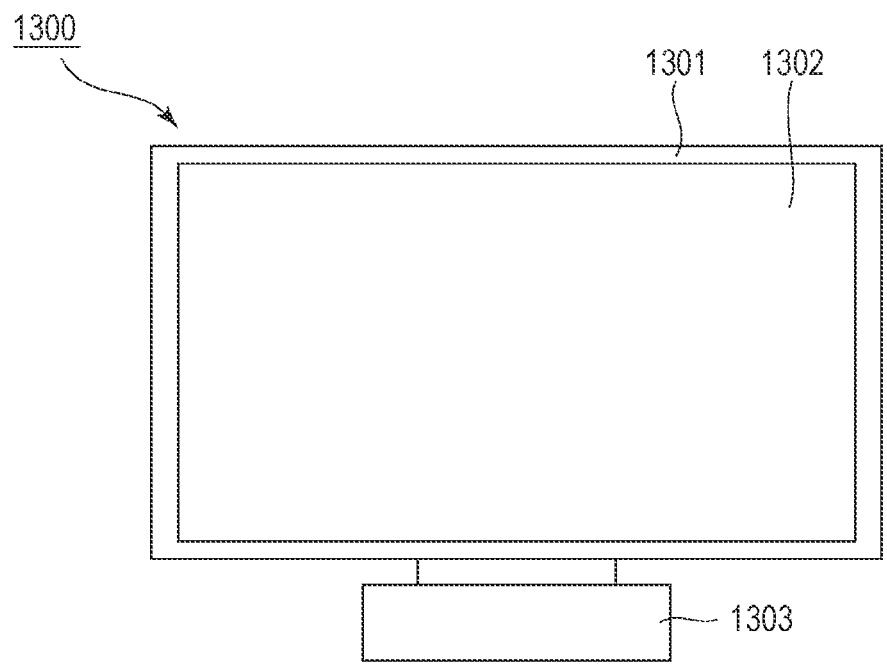
FIG. 7A is a schematic view of an example of a display apparatus according to an embodiment of the present invention.

FIG. 7A is a schematic view of an example of a display apparatus according to this embodiment. FIG. 7A illustrates a display apparatus such as a television monitor or a PC monitor. A display apparatus 1300 includes a frame 1301 and a display unit 1302. The display unit 1302 may employ the light-emitting device according to this embodiment.

The display apparatus includes a base 1303, which supports the frame 1301 and the display unit 1302. The base 1303 is not limited to the form illustrated in FIG. 7A. The lower side of the frame 1301 may also function as the base.

The frame 1301 and the display unit 1302 may be curved. The radius of the curvature may be 5000 mm or more and 6000 mm or less.

Figure 7B:
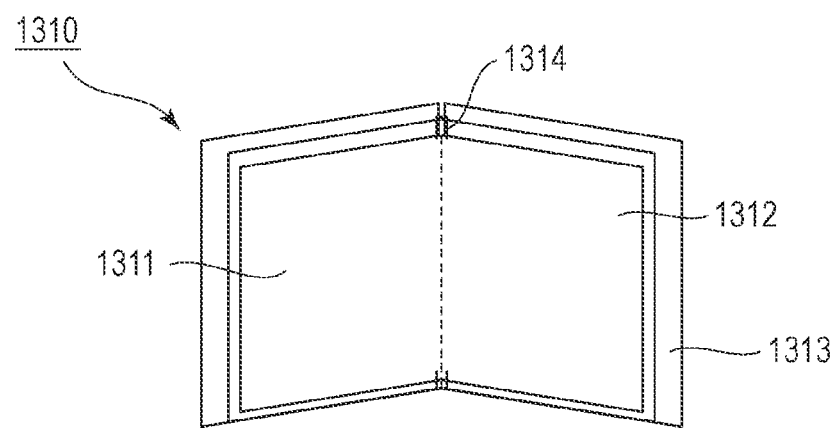
FIG. 7B is a schematic view of another example of a display apparatus according to an embodiment of the present invention.

FIG. 7B is a schematic view of another example of the display apparatus according to this embodiment. A display apparatus 1310 in FIG. 7B can be folded, namely a foldable display apparatus. The display apparatus 1310 includes a first display unit 1311, a second display unit 1312, a housing 1313, and a folding point 1314. The first display unit 1311 and the second display unit 1312 may include the light-emitting device according to this embodiment. The first display unit 1311 and the second display unit 1312 may be collectively designed as a seamless single display apparatus. The first display unit 1311 and the second display unit 1312 can be sectioned with respect to the folding point. The first display unit 1311 and the second display unit 1312 may individually display different images; and the first and second display units may collectively display a single image.

Figure 8A:
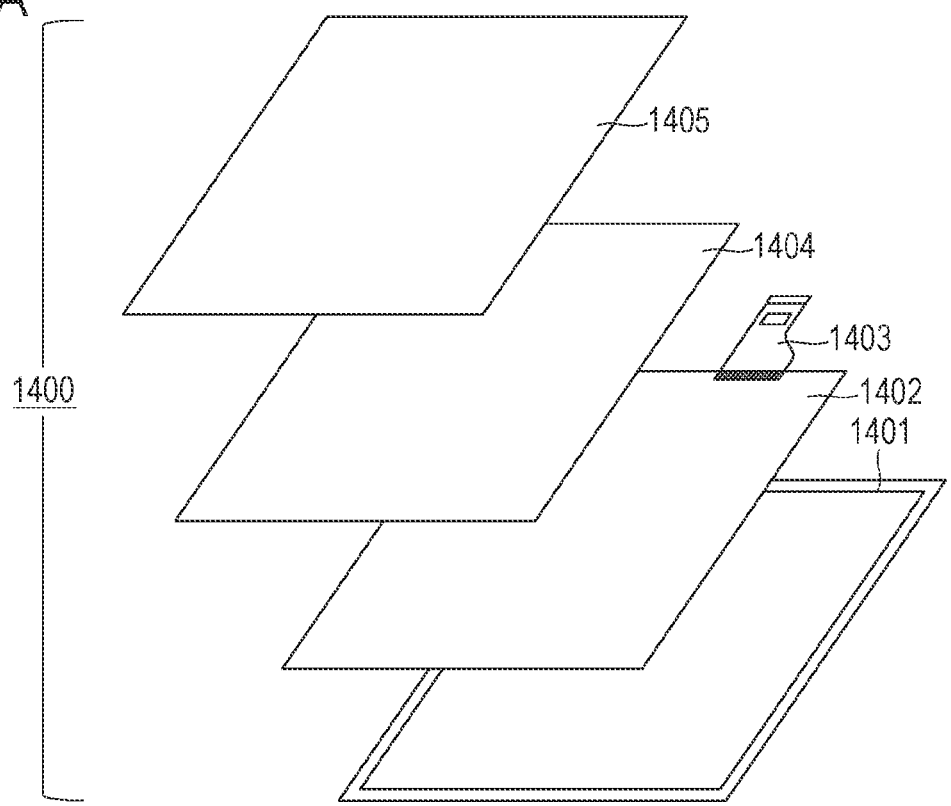
FIG. 8A is a schematic view of an example of an illumination apparatus according to an embodiment of the present invention.

FIG. 8A is a schematic view of an example of an illumination apparatus according to this embodiment. An illumination apparatus 1400 may include a housing 1401, a light source 1402, a circuit substrate 1403, an optical film 1404, and a light diffusion unit 1405. The light source may include the organic light-emitting element according to this embodiment. An optical filter may be provided to improve color rendering of the light source. The light diffusion unit is configured to effectively diffuse light from the light source to deliver the light to a wide area, such as lighting up. The optical filter and the light diffusion unit may be provided on the light exit side of the illumination. The illumination may be optionally equipped with a cover for the outermost portion thereof.

The illumination apparatus is, for example, an apparatus configured to illuminate the inside of a room. The illumination apparatus may be configured to emit light of any color of white, neutral white, and colors from blue to red. The illumination apparatus may include a light modulation circuit for modulating the light.

The illumination apparatus may include an organic light-emitting element according to an embodiment of the present invention and a power supply circuit connected to the organic light-emitting element. The power supply circuit is configured to convert alternating current voltage to direct current voltage. The "white" corresponds to a color temperature of 4200 K. The "neutral white" corresponds to a color temperature of 5000 K. The illumination apparatus may include a color filter.

The illumination apparatus according to this embodiment may include a heat dissipation unit. The heat dissipation unit is configured to release heat inside of the apparatus to the outside of the apparatus. The heat dissipation unit is formed of, for example, a metal having a high specific heat or liquid silicone.

Figure 8B:
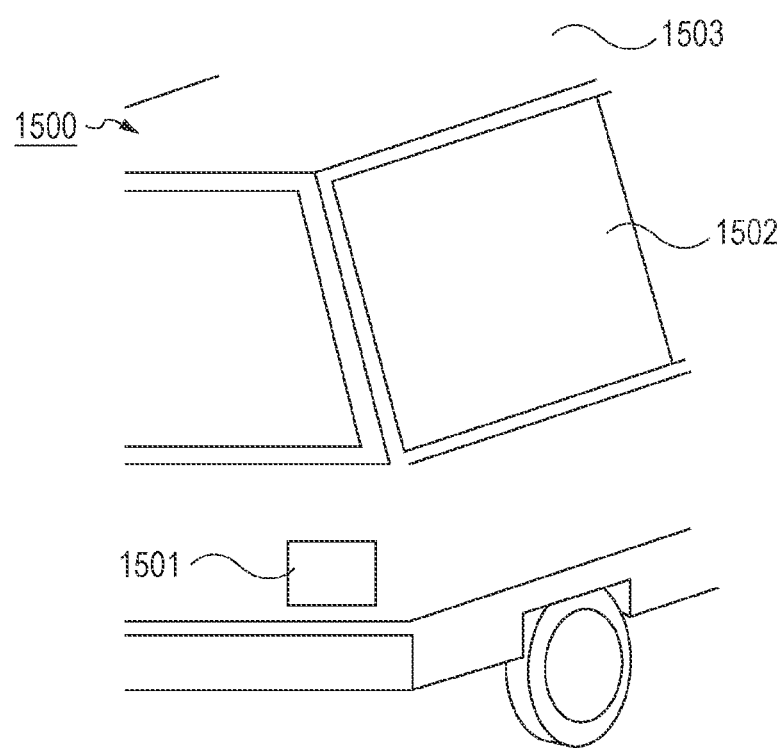
FIG. 8B is a schematic view of an automobile serving as an example of a moving object according to an embodiment of the present invention.

FIG. 8B is a schematic view of an automobile serving as an example of a moving object according to this embodiment. The automobile includes a tail lamp serving as an example of the illumination unit. An automobile 1500 includes a tail lamp 1501 that may be configured to turn on upon braking, for example.

The tail lamp 1501 may include the organic light-emitting element according to this embodiment. The tail lamp may include a protective member for protecting the organic EL element. The protective member is not limited in terms of material as long as it has relatively high strength and is transparent. The protective member can be formed of polycarbonate, for example. The polycarbonate may be mixed with, for example, a furandicarboxylic acid derivative or an acrylonitrile derivative.

The automobile 1500 may include an automobile body 1503 and a window 1502 attached to the automobile body 1503. When the window is not windows for checking ahead or behind of the automobile, it may be designed as a transparent display. This transparent display may include the organic light-emitting element according to this embodiment. In this case, constituent members of the organic light-emitting element, such as electrodes, are provided as transparent members.

The moving object according to this embodiment may be a ship, an aircraft, or a drone, for example. The moving object may include a body and an illumination unit provided to the body. The illumination unit may emit light in order to indicate the position of the body. The illumination unit includes the organic light-emitting element according to this embodiment.

Figure 9A:
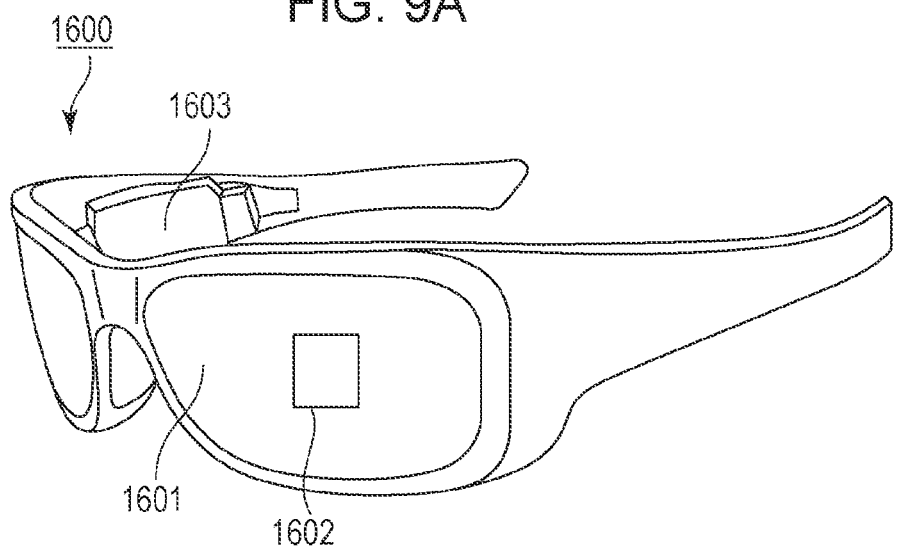
FIGS. 9A and 9B are schematic views of examples of a wearable device according to an embodiment of the present invention.

Referring to FIG. 9A, application examples of the above-described display apparatuses according to the embodiments will be described. The display apparatus is applicable to systems that are wearable devices such as smart glasses, HMDs, and smart contact lenses. The image pickup display apparatus used in such application examples includes an image pickup apparatus configured to perform photoelectric conversion of visible light, and a display apparatus configured to emit visible light.

FIG. 9A illustrates glasses 1600 (smart glasses) serving as an application example. In the glasses 1600, on the front side of a lens 1601, an image pickup apparatus 1602 is disposed at inside of the lens 1601. The image pickup apparatus is exemplified as a CMOS sensor or a SPAD. In addition, on the backside of the lens 1601, the display apparatus according to any one of the above-described embodiments is disposed.

The glasses 1600 further include a controller 1603. The controller 1603 functions as a power supply configured to supply electric power to the image pickup apparatus 1602 and the display apparatus according to any one of the embodiments. The controller 1603 is configured to control operations of the image pickup apparatus 1602 and the display apparatus. In the lens 1601, an optical system configured to focus light onto the image pickup apparatus 1602 is formed.

Figure 9B:
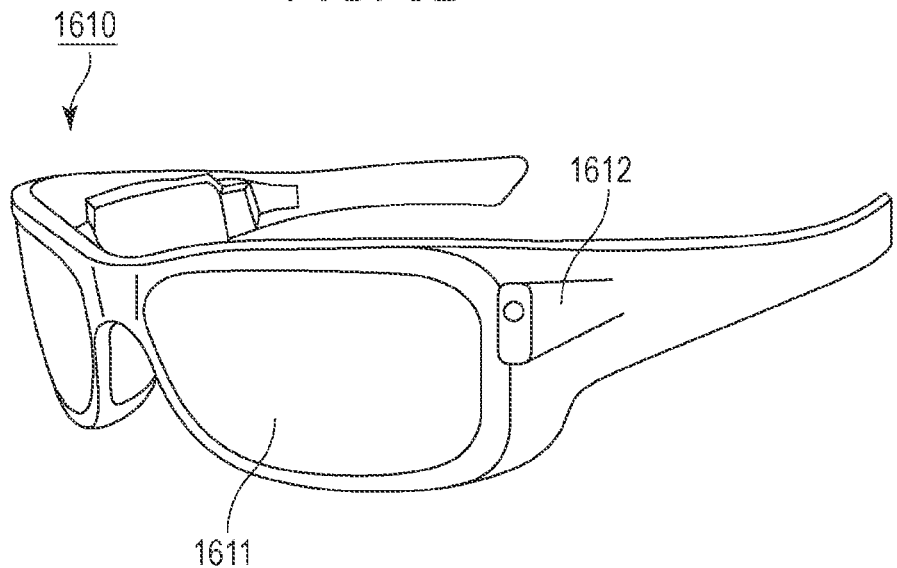

FIG. 9B illustrates glasses 1610 (smart glasses) serving as an application example. The glasses 1610 include a controller 1612. On the controller 1612, an image pickup apparatus corresponding to the image pickup apparatus 1602 in FIG. 9A and a display apparatus are mounted. In a lens 1611, an optical system configured to project light from the image pickup apparatus within the controller 1612 and the display apparatus is formed, and images are projected onto the lens 1611. The controller 1612 functions as a power supply configured to supply electric power to the image pickup apparatus and the display apparatus and controls operations of the image pickup apparatus and the display apparatus. The controller may include a gaze detection unit configured to detect the gaze of the wearer. The gaze may be detected using infrared radiation. An infrared-emitting unit emits infrared light to the eye of the user gazing the displayed image. The infrared light emitted is reflected by the eyeball, and the reflected light is detected by an image pickup unit including a light-receiving element to provide the captured image of the eyeball. A reduction unit is configured to reduce light from the infrared-emitting unit to the display unit in plan view, to reduce deterioration of image quality.

From the captured image of the eyeball obtained by capturing the infrared light, the user's gaze to the displayed image is detected. For the gaze detection using the captured image of the eyeball, a publicly known method is appropriately applicable. For example, the gaze detection method based on the Purkinje image due to reflection of irradiation light at the cornea is usable.

More specifically, the pupil center corneal reflection technique is used to perform gaze detection processing. The pupil center corneal reflection technique is used, on the basis of the pupil image and the Purkinje image included in the captured image of the eyeball, to calculate the gaze vector representing the orientation of the eyeball (rotation angle), to thereby detect the user's gaze.

A display apparatus according to an embodiment of the present invention includes an image pickup apparatus including a light-receiving element, and may control, on the basis of the user's gaze data from the image pickup apparatus, the displayed image of the display apparatus.

Specifically, the display apparatus determines, on the basis of the gaze data, a first viewing region that the user gazes, and a second viewing region other than the first viewing region. The first viewing region and the second viewing region may be determined by the controller of the display apparatus, or on the basis of the determination result received from an outer controller. In the display area of the display apparatus, the display resolution of the first viewing region may be controlled to be higher than the display resolution of the second viewing region. In other words, the resolution of the second viewing region may be controlled to be lower than that of the first viewing region.

The display area includes a first display area and a second display area different from the first display area, wherein on the basis of the gaze data from the first display area and the second display area, an area of a higher priority is determined. The first display area and the second display area may be determined by the controller of the display apparatus, or on the basis of the determination result received from an outer controller. The resolution of the area of a higher priority may be controlled to be higher than the resolution of the area other than the area of a higher priority. In other words, the resolution of the area of a lower priority may be controlled to be lower than the resolution of the area of a higher priority.

Note that the first viewing region or the area of a higher priority may be determined using AI. AI may be a model configured to, on the basis of supervised data of images of eyeballs and the actual gaze directions of the eyeballs in the images, estimate the angle of the gaze direction and the distance to the target of the gaze from images of eyeballs. The AI program may be stored in the display apparatus, in the image pickup apparatus, or in an outer apparatus. When the AI program is stored in the outer apparatus, it is transmitted via communication to the display apparatus.

In the case of controlling displaying on the basis of visual recognition detection, the display apparatus can be applied to smart glasses further including an image pickup apparatus configured to capture the external images. The smart glasses are configured to display captured external data in real time.

Figure 10A:
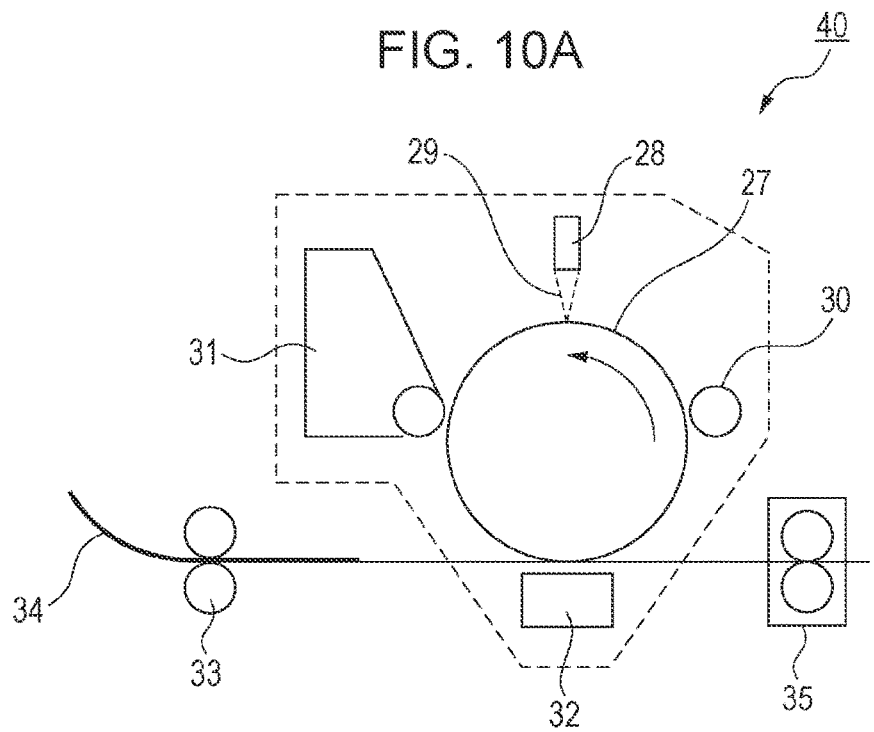
FIG. 10A is a schematic view of an image-forming apparatus according to an embodiment of the present invention.
Figure 10B:
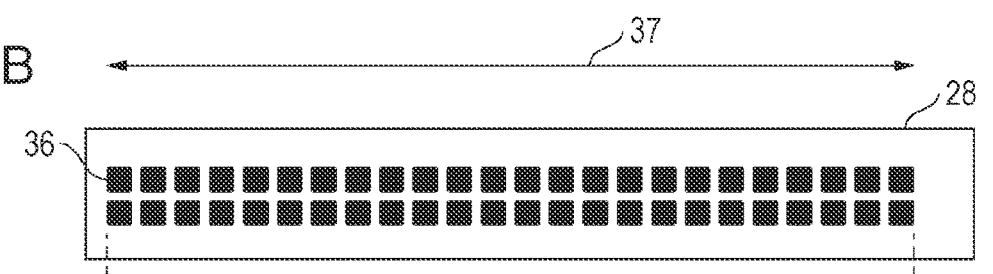
FIG. 10B and FIG. 10C are schematic views of configurations in which a plurality of light-emitting units of exposure light sources are arranged in elongated substrates.
Figure 10C:
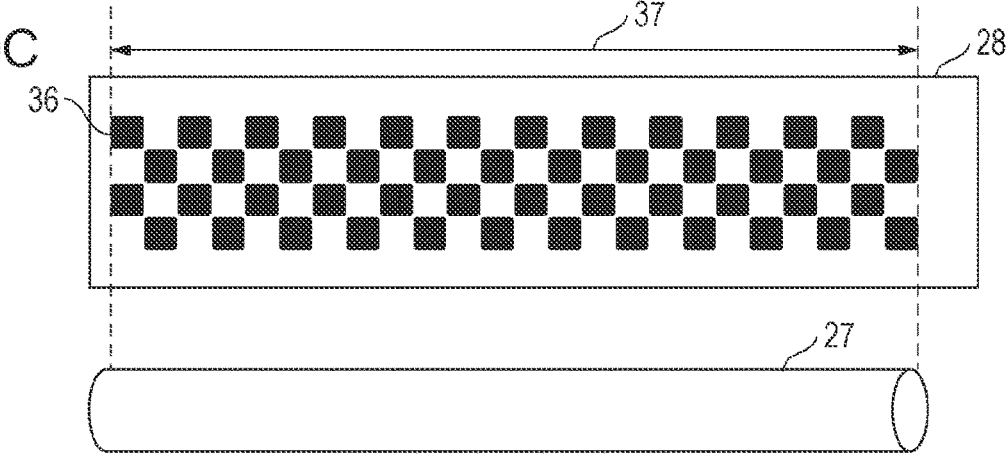

FIGS. 10A to 10C illustrate an image-forming apparatus according to an embodiment of the present invention. FIG. 10A is a schematic view of an image-forming apparatus 40 according to an embodiment of the present invention. The image-forming apparatus includes a photoreceptor, an exposure light source, a development unit, a charging unit, a transfer unit, a conveyance roller, and a fixing unit.

From an exposure light source 28, light 29 is emitted, to form an electrostatic latent image on the surface of a photoreceptor 27. This exposure light source includes an organic light-emitting element according to an embodiment of the present invention. A development unit 31 includes toner and the like. A charging unit 30 charges the photoreceptor. A transfer unit 32 transfers the developed image onto a recording medium 34. A conveyance unit 33 conveys the recording medium 34. The recording medium 34 is, for example, paper. A fixing unit 35 fixes the image formed on the recording medium.

FIG. 10B and FIG. 10C are schematic views of configurations in which, in an exposure light source 28, a plurality of light-emitting units 36 are arranged on an elongated substrate. A direction 37 is parallel to the axis of the photoreceptor and is a column direction in which organic light-emitting elements are arranged. This column direction is the same as the direction of the axis around which the photoreceptor 27 rotates. This direction can also be referred to as the long-axis direction of the photoreceptor.

FIG. 10B illustrates the structure in which light-emitting units are arranged in the long-axis direction of the photoreceptor. Unlike FIG. 10B, FIG. 10C illustrates a structure in which, in the first column and the second column, light-emitting units are staggered in the column direction. The first column and the second column are disposed at different positions in the row direction.

In the first column, a plurality of light-emitting units are disposed with a space therebetween. The second column includes light-emitting units at positions corresponding to the spaces between the light-emitting units of the first column. Thus, also in the row direction, a plurality of light-emitting units are arranged with a space therebetween.

The arrangement in FIG. 10C can also be referred to as, for example, a grid pattern, a staggered check pattern, or a checkered pattern.

As have been described so far, apparatuses employing the organic light-emitting element according to this embodiment enable displaying of images with high quality for a long time with stability.

EXAMPLES

Example 1

The organic light-emitting element according to the first embodiment was produced and evaluated. As illustrated in FIG. 2A, on an insulating layer, a first electrode is formed by patterning and a pixel division layer is formed. The pixel division layer was formed of a silicon oxide film. The pixel division layer was formed so as to have a layer thickness of 60 nm. The pixel division layer was formed such that the side-wall tapering angles on the pixel opening side and on the pixel-to-pixel side were about 60°. The pixel array was formed so as to have a delta pattern in which the pixel-opening intervals were set to 1.4 μm and the electrode intervals of the first electrodes were set to 0.6 μm. The substrate was washed, dried, and subsequently conveyed to a vacuum film-formation apparatus; the substrate in the pretreatment chamber was subjected to a surface pretreatment step using ultraviolet radiation or plasma; subsequently, while being kept in the vacuum, the substrate was conveyed to the vapor deposition chamber and subjected to the following step.

On the substrate, an electron extraction layer was formed using the following Compound 1 so as to have a thickness of 8 nm.

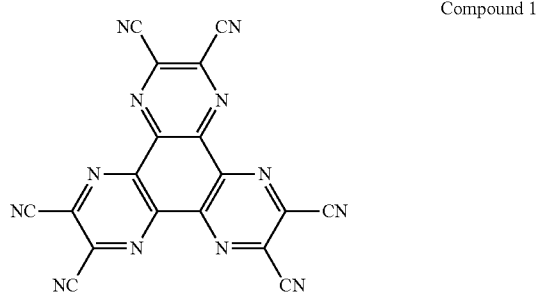 [SMILES: N#Cc1nc2c3nc(C#N)c(C#N)nc3c3nc(C#N)c(C#N)nc3c2nc1C#N]

Compound 1

Subsequently, the first charge transport layer, the second charge transport layer, and the third charge transport layer were formed. The layers were formed using charge transport layer materials so as to have layer thicknesses as described in Table 2.

Table 1 describes the hole mobilities of HT39 and HT27 and hole mobilities of HT39:HT27 mixture layers in which the mixing ratio (volume ratio) is changed.

TABLE 1

| Layer configuration | Mixing ratio | Hole mobility (cm$^2$/V · s) |
| --- | --- | --- |
| HT39 | 100:0 | 5E−3 |
| HT39:HT27 | 85:15 | 4E−3 |
| HT39:HT27 | 70:30 | 3E−3 |
| HT39:HT27 | 50:50 | 2E−3 |
| HT39:HT27 | 25:75 | 1E−3 |
| HT39:HT27 | 15:85 | 5E−4 |
| HT27 | 0:100 | 4E−4 |

For the first light-emitting layer, a pyrene derivative (Compound 2) serving as the host material and a green dopant (Compound 3) and a red dopant (Compound 4) serving as light-emitting dopants were co-evaporated in weight ratios of 2% and 0.2% to form a layer having a thickness of 10 nm.

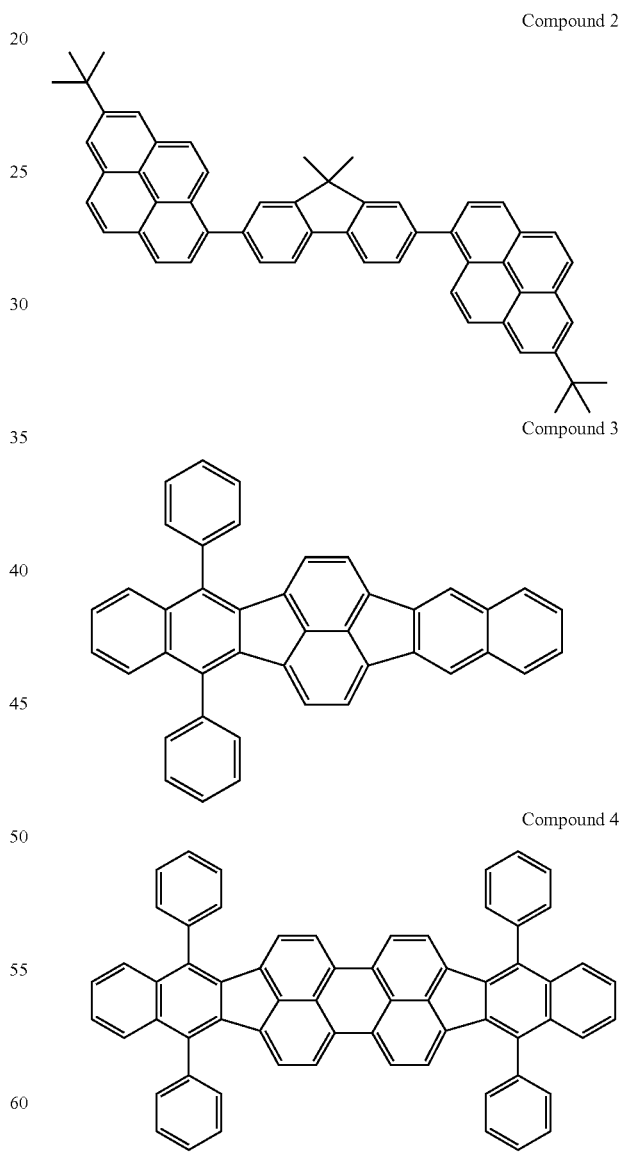

For the second light-emitting layer, a host (Compound 2) and a blue-light-emitting dopant (Compound 5) were co-evaporated to form the layer. The co-evaporation was performed such that the weight ratio of the blue-light-emitting dopant to the host was 1.5% and the layer thickness was 10 nm. Subsequently, an electron transport layer (Compound 6) was formed so as to have a thickness of 40 nm. Subsequently, an electron injection layer was formed using LiF so as to have a thickness of 0.5 nm; subsequently, as the second electrode, a MgAg alloy containing Mg and Ag in a ratio of 1:1 was used to form a film having a thickness of 10 nm. Subsequently, as a protective layer, a SiN film having a thickness of 1.5 μm was formed by a CVD process.

Compound 5

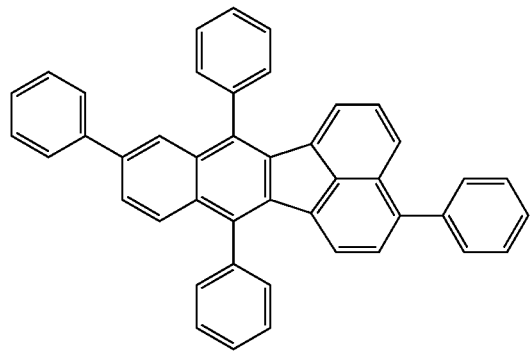

Compound 6

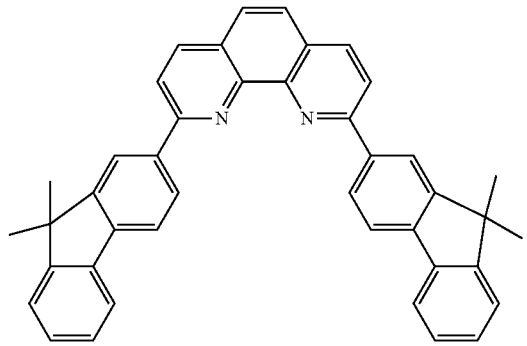

After formation of the protective layer, as illustrated in FIG. 2A, on each of the sub pixel, a color filter and a microlens being an optical member were formed, to produce an organic light-emitting element.

For the red pixel, the green pixel, and the blue pixel of the organic light-emitting element, EL characteristics for each sub pixel were evaluated. For the items of evaluation, the color gamut during displaying of a white screen at a low luminance (10 cd/m$^2$), and a voltage required for displaying a white screen at a high luminance (500 cd/m$^2$) were employed. The results will be described in Table 2.

TABLE 2

| Element configuration | | | First charge transport layer (μ1, d1) | Second charge transport layer (μ2, d2) | Third charge transport layer (μ3, d3) | Color gamut (SRGB cover ratio) @10 cd/m$^2$ | Voltage @500 cd/m$^2$ |
|---|---|---|---|---|---|---|---|
| D100 | Example | Material | HT39 | HT39:HT27 (50:50) | HT27 | 95% | 4.0 V |
| | | Mobility μ (cm$^2$/Vs) | 5E−3 | 2E−3 | 4E−4 | | |
| | | Layer thickness d (nm) | 2 | 5 | 10 | | |
| D101 | Example | Material | HT39 | HT39:HT27 (50:50) | HT27 | 90% | 3.8 V |
| | | Mobility μ (cm$^2$/Vs) | 5E−3 | 2E−3 | 4E−4 | | |
| | | Layer thickness d (nm) | 5 | 2 | 10 | | |
| D102 | Example | Material | HT39 | HT39:HT27 (50:50) | HT27 | 80% | 3.8 V |
| | | Mobility μ (cm$^2$/Vs) | 5E−3 | 2E−3 | 4E−4 | | |
| | | Layer thickness d (nm) | 5 | 4 | 10 | | |
| D103 | Example | Material | HT39 | HT39:HT27 (25:75) | HT27 | 100% | 4.1 V |
| | | Mobility μ (cm$^2$/Vs) | 5E−3 | 1E−3 | 4E−4 | | |
| | | Layer thickness d (nm) | 2 | 5 | 10 | | |
| D104 | Example | Material | HT39 | HT39:HT27 (15:85) | HT27 | 100% | 4.2 V |
| | | Mobility μ (cm$^2$/Vs) | 5E−3 | 5E−4 | 4E−4 | | |
| | | Layer thickness d (nm) | 2 | 5 | 10 | | |

TABLE 2-continued

| Element configuration | | | First charge transport layer ($\mu$1, d1) | Second charge transport layer ($\mu$2, d2) | Third charge transport layer ($\mu$3, d3) | Color gamut (SRGB cover ratio) @10 cd/m$^2$ | Voltage @500 cd/m$^2$ |
|---|---|---|---|---|---|---|---|
| D105 | Comparative Example | Material | HT39 | — | HT27 | 20% | 3.7 V |
| | | Mobility $\mu$ (cm$^2$/Vs) | 5E−3 | — | 4E−4 | | |
| | | Layer thickness d (nm) | 7 | — | 10 | | |
| D106 | Comparative Example | Material | HT39 | — | HT27 | 80% | 8.0 V |
| | | Mobility $\mu$ (cm$^2$/Vs) | 5E−3 | — | 4E−4 | | |
| | | Layer thickness d (nm) | 2 | — | 15 | | |
| D107 | Comparative Example | Material | HT39 | HT39:HT27 (50:50) | HT27 | 20% | 3.7 V |
| | | Mobility $\mu$ (cm$^2$/Vs) | 5E−3 | 2E−3 | 4E−4 | | |
| | | Layer thickness d (nm) | 10 | 5 | 2 | | |
| D108 | Comparative Example | Material | HT39 | HT39:HT27 (50:50) | HT27 | 25% | 3.7 V |
| | | Mobility $\mu$ (cm$^2$/Vs) | 5E−3 | 2E−3 | 4E−4 | | |
| | | Layer thickness d (nm) | 10 | 2 | 5 | | |
| D109 | Comparative Example | Material | HT39 | HT39:HT27 (50:50) | HT27 | 70% | 3.9 V |
| | | Mobility $\mu$ (cm$^2$/Vs) | 5E−3 | 2E−3 | 4E−4 | | |
| | | Layer thickness d (nm) | 6 | 4 | 10 | | |
| D110 | Comparative Example | Material | HT39:HT27 (50:50) | HT39 | HT27 | 20% | 4.5 V |
| | | Mobility $\mu$ (cm$^2$/Vs) | 2E−3 | 5E−3 | 4E−4 | | |
| | | Layer thickness d (nm) | 2 | 5 | 10 | | |
| D111 | Comparative Example | Material | HT39:HT27 (50:50) | HT39 | HT27 | 20% | 4.6 V |
| | | Mobility $\mu$ (cm$^2$/Vs) | 2E−3 | 5E−3 | 4E−4 | | |
| | | Layer thickness d (nm) | 5 | 5 | 2 | | |
| D112 | Comparative Example | Material | HT27 | HT39 | HT39:HT27 (50:50) | 20% | 4.8 V |
| | | Mobility $\mu$ (cm$^2$/Vs) | 4E−4 | 5E−3 | 2E−3 | | |
| | | Layer thickness d (nm) | 2 | 5 | 10 | | |
| D113 | Comparative Example | Material | HT27 | HT39:HT27 (50:50) | HT39 | 40% | 8.0 V |
| | | Mobility $\mu$ (cm$^2$/Vs) | 4E−4 | 2E−3 | 5E−3 | | |
| | | Layer thickness d (nm) | 10 | 2 | 5 | | |

The above-described results show the following: in element configurations D100 to D104 in which the charge transport layer satisfies Formula (1) and Formula (2), the color gamut is 80% or more and the driving voltage is about 4 V; compared with Comparative Examples D105 to D113, high color gamut is achieved and the driving voltage is reduced. Comparative Examples D105, D106, D111, and D113 do not satisfy Formula (1) and Formula (2). D107 to D109 are Comparative Examples that satisfy Formula (1), but do not satisfy Formula (2). D110 and D112 are Comparative Examples that satisfy Formula (2), but do not satisfy Formula (1).

Example 2

An organic light-emitting element was produced and evaluated as in Example 1 except that, in the D100 configuration in Example 1, the second charge transport layer was formed using HT10 (hole mobility: 1E−3 cm$^2$/Vs) alone. This Example, which satisfied Conditional formulas 1 and 2, provided a color gamut of 90% and a voltage of 4.0 V; thus, the high color gamut and the low-voltage driving were confirmed.

Example 3

An organic light-emitting element according to the second embodiment was produced. As the organic light-emitting element, D100 according to the first embodiment was produced and evaluated as in Example 1. This Example satisfied Conditional formulas 1 and 2. The color gamut was 80% and the voltage was 4.0 V; thus, the high color gamut and the low driving voltage were confirmed.

Example 4

An organic light-emitting element was produced such that, in the first embodiment, the first electrode was a cathode and the second electrode was an anode. On the first electrode, an electron injection layer formed of CsF and having a thickness of 0.5 nm was formed. As the first charge transport layer, an electron transport layer formed of Bathophenanthroline (Bphen) having a high mobility of 3E−4 cm$^2$/Vs and having a thickness of 2 nm was formed. Subsequently, Bphen and Alq$_3$ having a mobility of about 1E−7 cm$^2$/Vs were mixed and used to form the second charge transport layer having a mobility of 1E−5 cm$^2$/Vs and having a thickness of 5 nm by co-evaporation. Subsequently, a layer formed of Alq$_3$ and having a thickness of 10 nm was formed as the third charge transport layer. The first charge transport layer, the second charge transport layer, and the third charge transport layer satisfied Formula 1 and Formula 2 as in the first embodiment. Subsequently, as the light-emitting layer, the second light-emitting layer having a thickness of 10 nm and the first light-emitting layer having a thickness of 10 nm in Example 1 were formed in this order. Subsequently, as the hole transport layer, a layer formed of HT27 and having a thickness of 10 nm and a layer formed of HT39 and having a thickness of 20 nm were formed. Subsequently, as the electron extraction layer, a layer formed of HAT-CN and having a thickness of 10 nm was formed. Finally, as the anode, a layer formed of MgAg (1:1) and having a thickness of 10 nm was formed; subsequently, as the protective layer, a SiN film having a thickness of 1.5 µm was formed by a CVD process. After formation of the protective layer, as illustrated in FIG. 2A, on each of the sub pixels, a color filter and a microlens being an optical member were formed to produce an organic light-emitting element.

The organic light-emitting element was evaluated as in Example 1. The color gamut was 80% and the driving voltage was 5.0 V; thus, the high color gamut and the low driving voltage were confirmed.

As has been described so far, apparatuses including organic light-emitting elements according to the embodiments provide display panels that provide high color gamut and high quality and that operate at low driving voltage and low power consumption.

The present invention can provide an organic light-emitting element in which the driving voltage of the organic light-emitting element is reduced and unintended light emission of adjacent organic light-emitting elements can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-059449, filed Mar. 31, 2022, which is hereby incorporated by reference herein in its entirety.

What is claimed is:

1. An organic light-emitting element comprising:
a first electrode on an insulating layer, a first light-emitting layer on the first electrode, a second electrode on the first light-emitting layer; and
a charge transport layer between the first electrode and the first light-emitting layer,
wherein the charge transport layer includes a first charge transport layer, a second charge transport layer, and a third charge transport layer in this order from the first electrode,
the first charge transport layer, the second charge transport layer, and the third charge transport layer satisfy Formulas (1) and (2) below:

$$\mu1 > \mu2 > \mu3 \quad (1)$$

$$d1 + d2 < d3 \quad (2)$$

wherein, in Formula (1), µ1 is a charge mobility of the first charge transport layer, µ2 is a charge mobility of the second charge transport layer, and µ3 is a charge mobility of the third charge transport layer, and
in Formula (2), d1 is a layer thickness of the first charge transport layer, d2 is a layer thickness of the second charge transport layer, and d3 is a layer thickness of the third charge transport layer.

2. The organic light-emitting element according to claim 1, wherein the layer thickness of the second charge transport layer is greater than the layer thickness of the first charge transport layer.

3. The organic light-emitting element according to claim 1, wherein the first charge transport layer contains a first organic compound and the third charge transport layer contains a third organic compound, and
the second charge transport layer is a layer comprising a mixture of the first organic compound and the third organic compound.

4. The organic light-emitting element according to claim 3, wherein a content of the third organic compound relative to a total amount of the first organic compound and the third organic compound of the second charge transport layer is 50 vol % or more.

5. The organic light-emitting element according to claim 1, wherein the charge transport layer is a hole transport layer.

6. The organic light-emitting element according to claim 1, wherein the charge transport layer is an electron transport layer.

7. The organic light-emitting element according to claim 1, further comprising, between the first light-emitting layer and the second electrode, an electron extraction layer, a fourth charge transport layer, a fifth charge transport layer, a sixth charge transport layer, and a second light-emitting layer in this order, wherein the fourth charge transport layer, the fifth charge transport layer, and the sixth charge transport layer satisfy Formulas (3) and (4) below:

$$\mu 4 > \mu 5 > \mu 6 \tag{3}$$

$$d4+d5<d6 \tag{4}$$

wherein, in Formula (3), $\mu 4$ is a charge mobility of the fourth charge transport layer, $\mu 5$ is a charge mobility of the fifth charge transport layer, and $\mu 6$ is a charge mobility of the sixth charge transport layer, and in Formula (4), d4 is a layer thickness of the fourth charge transport layer, d5 is a layer thickness of the fifth charge transport layer, and d6 is a layer thickness of the sixth charge transport layer.

8. The organic light-emitting element according to claim 1, wherein the charge transport layer has a thickness of 20 nm or less.

9. The organic light-emitting element according to claim 1, further comprising a reflective layer between the insulating layer and the first electrode, wherein a first distance between the reflective layer and the first light-emitting layer is set so as to intensify light emitted from the first light-emitting layer.

10. A light-emitting device comprising:

a first organic light-emitting element being the organic light-emitting element according to claim 9, and a second organic light-emitting element different from the first organic light-emitting element, wherein the second organic light-emitting element is an organic light-emitting element including a first electrode on the insulating layer, a reflective layer between the insulating layer and the first electrode, a first light-emitting layer on the first electrode, and a second electrode on the first light-emitting layer, wherein in the second organic light-emitting element, a second distance between the reflective layer and the first light-emitting layer is set so as to intensify light emitted from the first light-emitting layer of the second light-emitting element, and wherein the first distance is different from the second distance.

11. The light-emitting device according to claim 10, wherein the first light-emitting layer of the first organic light-emitting element and the first light-emitting layer of the second organic light-emitting element are different in a wavelength of emitted light.

12. The light-emitting device according to claim 10, wherein the charge transport layer extends continuously from the first organic light-emitting element to the second organic light-emitting element.

13. The light-emitting device according to claim 10, comprising a plurality of organic light-emitting elements including the first organic light-emitting element and the second organic light-emitting element, wherein the plurality of organic light-emitting elements are arranged at 1000 pixels per inch, ppi, or more.

14. A display apparatus comprising a plurality of pixels, wherein at least one of the plurality of pixels includes the organic light-emitting element according to claim 1 and a transistor connected to the organic light-emitting element.

15. An image pickup apparatus comprising an optical unit including a plurality of lenses, an image pickup element configured to receive light having passed through the optical unit, and a display unit configured to display an image captured by the image pickup element, wherein the display unit includes the organic light-emitting element according to claim 1.

16. An electronic apparatus comprising a display unit including the organic light-emitting element according to claim 1, a housing including the display unit, and a communication unit disposed in the housing and configured to communicate with an external device.

17. An illumination apparatus comprising a light source including the organic light-emitting element according to claim 1, and a light diffusion unit or an optical film configured to transmit light emitted from the light source.

18. A moving object comprising an illumination unit including the organic light-emitting element according to claim 1 and a body equipped with the illumination unit.

19. An image-forming apparatus comprising a photoreceptor and an exposure light source configured to expose the photoreceptor, wherein the exposure light source includes the organic light-emitting element according to claim 1.

20. An organic light-emitting element comprising:

a first electrode, a second electrode, a first light-emitting layer disposed between the first electrode and the second electrode, and a charge transport layer between the first electrode and the first light-emitting layer, wherein the charge transport layer includes a first charge transport layer, a second charge transport layer having a lower charge mobility than the first charge transport layer, and a third charge transport layer having a lower charge mobility than the first charge transport layer, and the first charge transport layer has a layer thickness less than a layer thickness of the second charge transport layer and a layer thickness of the third charge transport layer.

21. The organic light-emitting element according to claim 20, wherein the first charge transport layer is disposed between the first electrode and the second charge transport layer, and the third charge transport layer is disposed between the second charge transport layer and the first light-emitting layer.

22. The organic light-emitting element according to claim 20, further comprising:

between the first light-emitting layer and the second electrode, an electron extraction layer and a second light-emitting layer in this order, and between the electron extraction layer and the second light-emitting layer, a fourth charge transport layer, a fifth charge transport layer having a lower charge mobility than the fourth charge transport layer, and a sixth charge transport layer having a lower charge mobility than the fifth charge transport layer, wherein the fourth charge transport layer has a layer thickness less than the fifth charge transport layer and the sixth charge transport layer.

* * * * *